(12) United States Patent
Aoki et al.

(10) Patent No.: US 8,305,797 B2
(45) Date of Patent: Nov. 6, 2012

(54) INFORMATION RECORDING/REPRODUCING DEVICE

(75) Inventors: Shinya Aoki, Kanagawa-ken (JP); Kohichi Kubo, Kanagawa-ken (JP); Takayuki Tsukamoto, Kanagawa-ken (JP); Takahiro Hirai, Kanagawa-ken (JP); Chikayoshi Kamata, Kanagawa-ken (JP); Tsukasa Nakai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/044,384

(22) Filed: Mar. 9, 2011

(65) Prior Publication Data

US 2011/0216576 A1 Sep. 8, 2011

Related U.S. Application Data

(63) Continuation of application No. PCT/JP2008/066229, filed on Sep. 9, 2008.

(51) Int. Cl.
*G11C 11/00* (2006.01)

(52) U.S. Cl. .................. 365/151; 365/148; 257/3; 257/5

(58) Field of Classification Search .................. 365/151, 365/148; 257/3, 5
See application file for complete search history.

(56) References Cited

U.S. PATENT DOCUMENTS

| | | | | |
|---|---|---|---|---|
| 4,718,053 A * | 1/1988 | Sato et al. | .................. | 369/44.23 |
| 6,858,277 B1 * | 2/2005 | Yamada et al. | .............. | 428/64.1 |
| 6,875,505 B2 * | 4/2005 | Moriwaki et al. | ......... | 428/836.2 |
| 7,606,096 B2 | 10/2009 | Hamada et al. | | |
| 7,709,073 B2 * | 5/2010 | Kojima et al. | ............... | 428/64.1 |
| 7,733,684 B2 | 6/2010 | Kubo et al. | | |
| 7,838,877 B2 | 11/2010 | Aoki et al. | | |
| 7,852,739 B2 | 12/2010 | Koga et al. | | |
| 7,961,586 B2 | 6/2011 | Kubo et al. | | |
| 8,012,671 B2 * | 9/2011 | Kanchiku | .................. | 430/281.1 |
| 8,050,171 B2 | 11/2011 | Aoki et al. | | |
| 8,089,796 B2 * | 1/2012 | Tsukamoto et al. | ............ | 365/63 |
| 8,133,566 B2 * | 3/2012 | Nishihara et al. | ............ | 428/64.1 |
| 8,182,980 B2 * | 5/2012 | Adachi | ......................... | 430/302 |

(Continued)

FOREIGN PATENT DOCUMENTS

JP 2005-317787 11/2005

(Continued)

OTHER PUBLICATIONS

U.S. Appl. No. 13/228,938, filed Sep. 9, 2011, Hirai, et al.

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

According to one embodiment, an information recording/reproducing device includes a recording layer and a driver section. The recording layer has a first layer including a first compound. The first compound includes a mixed crystal of a first oxide containing a first metallic element and a second oxide. The second oxide has a crystal structure being same as the first oxide and contains a second metallic element different from the first metallic element. The driver section is configured to produce state change in the recording layer to record information by at least one of application of voltage to the recording layer and passage of current to the recording layer. Composition ratio of an element having a smaller ionic radius of the first and second metallic elements is not less than percolation threshold of a lattice formed of ions of the first and second metallic elements based on the crystal structure.

19 Claims, 15 Drawing Sheets

U.S. PATENT DOCUMENTS

| | | | |
|---|---|---|---|
| 8,188,566 B2 * | 5/2012 | Furumiya et al. | 257/516 |
| 2007/0269683 A1 | 11/2007 | Chen et al. | |
| 2007/0274193 A1 | 11/2007 | Akiyama et al. | |
| 2008/0239797 A1 | 10/2008 | Tsukamoto et al. | |
| 2008/0239932 A1 | 10/2008 | Kamata et al. | |
| 2010/0074001 A1 | 3/2010 | Kubo et al. | |
| 2010/0127235 A1 | 5/2010 | Tsukamoto et al. | |
| 2010/0142091 A1 | 6/2010 | Tsukamoto et al. | |
| 2010/0142261 A1 | 6/2010 | Kubo et al. | |
| 2010/0142262 A1 | 6/2010 | Tsukamoto et al. | |
| 2010/0202187 A1 | 8/2010 | Kubo et al. | |
| 2010/0226164 A1 | 9/2010 | Nagashima et al. | |
| 2010/0316831 A1 | 12/2010 | Kubo et al. | |
| 2011/0006277 A1 * | 1/2011 | Kubo et al. | 257/2 |
| 2011/0031459 A1 | 2/2011 | Kubo et al. | |
| 2011/0216576 A1 | 9/2011 | Aoki et al. | |

FOREIGN PATENT DOCUMENTS

| | | |
|---|---|---|
| JP | 2006-80259 | 3/2006 |
| JP | 2006-140464 | 6/2006 |
| JP | 2007-273618 | 10/2007 |
| JP | 2008-84512 | 4/2008 |
| JP | 2008-205191 | 9/2008 |
| WO | WO 2008/123307 A1 | 10/2008 |

OTHER PUBLICATIONS

U.S. Appl. No. 13/043,097, filed Mar. 8, 2011, Yamaguchi, et al.
U.S. Appl. No. 13/040,823, filed Mar. 4, 2011, Tsukamoto.
U.S. Appl. No. 12/889,558, filed Sep. 24, 2010, Tsukamoto, et al.
U.S. Appl. No. 12/884,880, filed Sep. 17, 2010, Kamata, et al.
U.S. Appl. No. 12/886,040, filed Sep. 20, 2010, Tsukamoto, et al.
U.S. Appl. No. 12/886,202, filed Sep. 20, 2010, Araki, et al.
U.S. Appl. No. 12/886,079, filed Sep. 20, 2010, Araki, et al.
Written Opinion of the International Searching Authority issued Dec. 16, 2008 in PCT/2008/066229, filed Sep. 9, 2008.
International Search Report issued Dec. 16, 2008 in PCT/JP2008/066229, filed Sep. 9, 2008 (with English translation of categories).

* cited by examiner

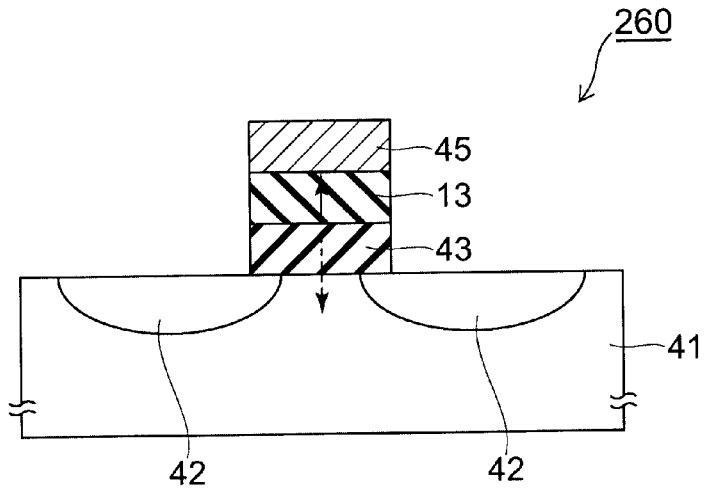
FIG. 13
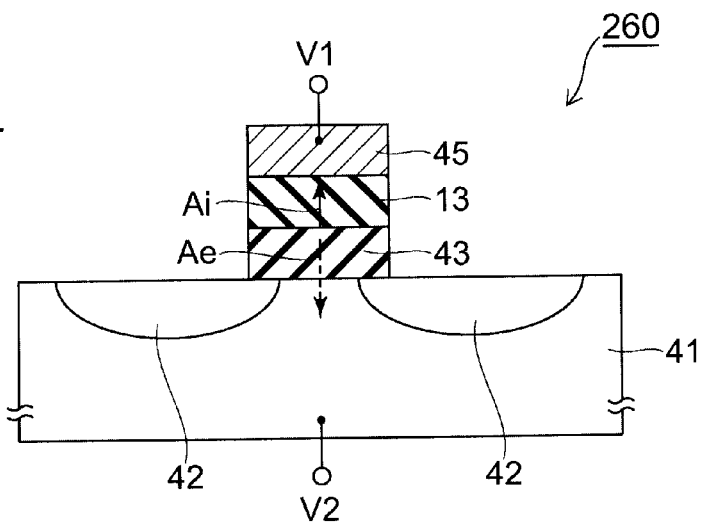
FIG. 14
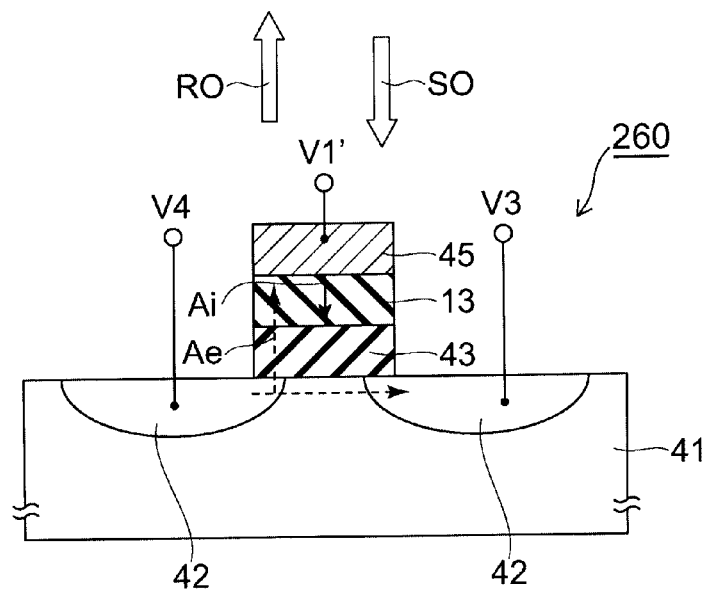

INFORMATION RECORDING/REPRODUCING DEVICE

CROSS-REFERENCE TO RELATED APPLICATIONS

This is a continuation application of International Application PCT/JP2008/066229, filed on Sep. 9, 2008; the entire contents of which are incorporated herein by reference.

FIELD

Embodiments described herein relate generally to an information recording/reproducing device.

BACKGROUND

Recently, small portable devices have become globally popular. At the same time, with the significant progress of high-speed information transmission networks, the demand for small, high-capacity nonvolatile memories have been rapidly expanding. Among them, in particular, NAND flash memories and small HDD (hard disk drive) have rapidly evolved in recording density and created a large market.

Under these circumstances, several ideas for novel memories have been proposed toward significantly exceeding the limit of memory density.

Among them, there is proposed a memory based on a resistance change material having a low resistance state and a high resistance state. More specifically, by applying a voltage pulse to the resistance change material, the low resistance state and the high resistance state can be repetitively changed. These two states are associated with binary data "0" and "1" to record data.

Known examples of such a resistance change material include ternary oxides containing transition metal elements such as perovskites and spinels (e.g., JP-2005-317787 (Kokai) and JP-A 2006-80259 (Kokai)) and binary oxides of transition metals (e.g., JP-A 2006-140464 (Kokai)). Furthermore, there is disclosed a technique using a solid solution formed by adding metals to various oxides (e.g., U.S. Patent Application Publication No. 2007/0269683A1).

It is pointed out that information recording/reproducing devices based on such resistance change materials have large power consumption, and low stability in repeated operation due to low thermal stability of each resistance state (e.g., S. Seo et al. Applied Physics Letters, vol. 85, p.p. 5655-5657).

BRIEF DESCRIPTION OF THE DRAWINGS

FIG. 13 is a schematic sectional view illustrating the configuration of the main part of an information recording/reproducing device according to a fourth embodiment;

FIG. 14 is a schematic sectional view illustrating the operation of the information recording/reproducing device according to the fourth embodiment;

DETAILED DESCRIPTION

Figure 1:
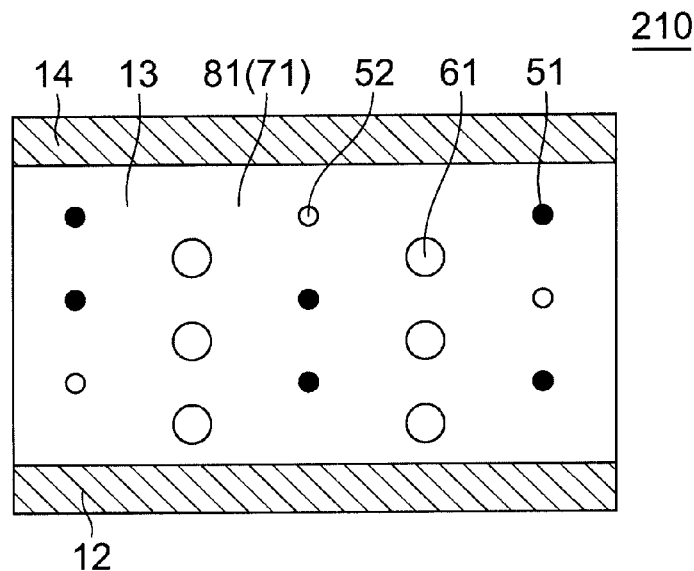
FIG. 1 is a schematic sectional view illustrating the configuration of the main part of an information recording/reproducing device according to a first embodiment.

In general, according to one embodiment, an information recording/reproducing device includes a recording layer and a driver section. The recording layer has a first layer including a first compound. The first compound includes a mixed crystal of a first oxide containing a first metallic element and a second oxide. The second oxide has a crystal structure being same as the first oxide and contains a second metallic element different from the first metallic element. The driver section is configured to produce state change in the recording layer to record information by at least one of application of voltage to the recording layer and passage of current to the recording layer. Composition ratio of an element having a smaller ionic radius of the first metallic element and the second metallic element is greater than or equal to percolation threshold of a lattice formed of ions of the first metallic element and ions of the second metallic element based on the crystal structure.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings, components similar to those described previously with reference to earlier figures are labeled with like reference numerals, and the detailed description thereof is omitted as appropriate.

First Embodiment

FIG. 1 is a schematic sectional view illustrating the configuration of the main part of an information recording/reproducing device according to a first embodiment.

Figure 2:
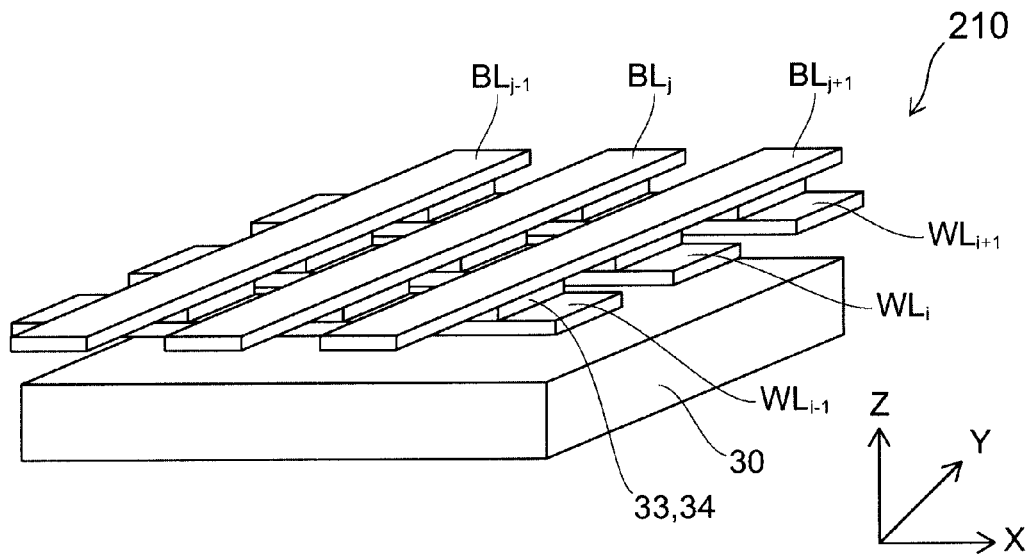
FIG. 2 is a schematic perspective view illustrating the configuration of the information recording/reproducing device according to the first embodiment.

FIG. 2 is a schematic perspective view illustrating the configuration of the information recording/reproducing device according to the first embodiment.

Figure 3:
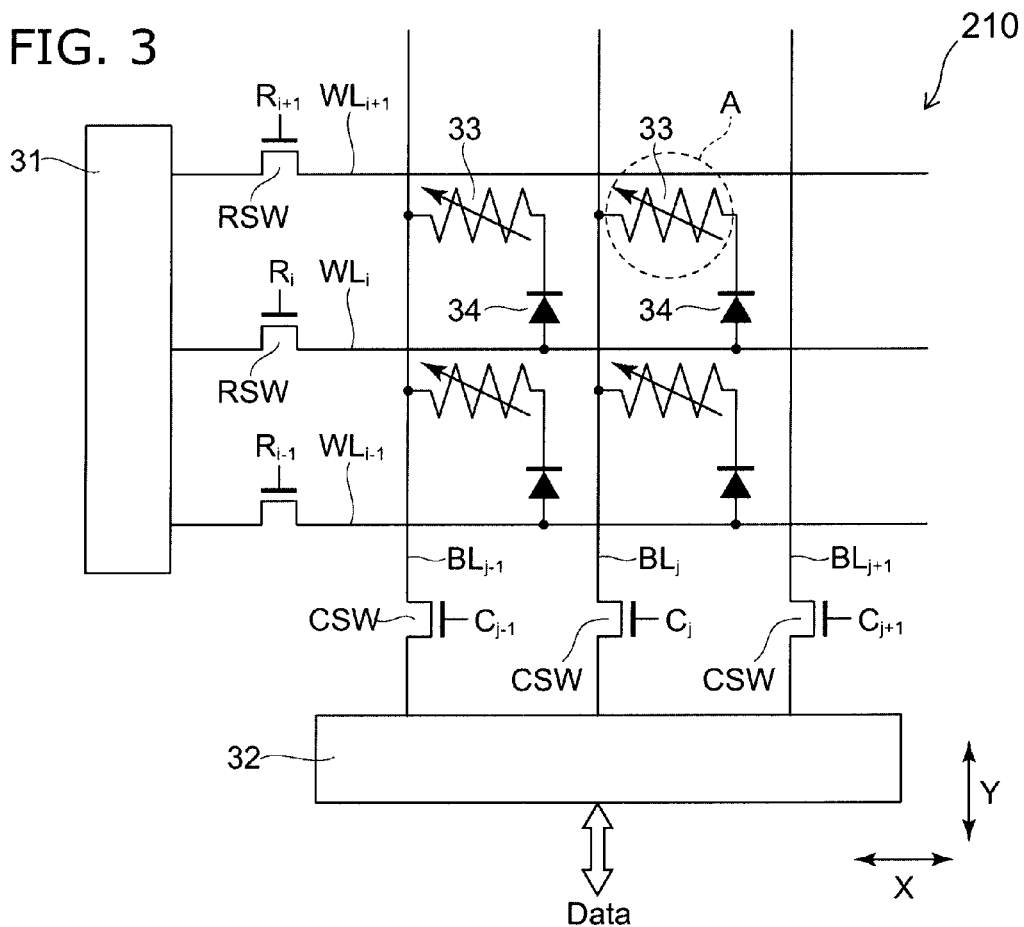
FIG. 3 is a schematic circuit diagram illustrating the configuration of the information recording/reproducing device according to the first embodiment.

FIG. 3 is a schematic circuit diagram illustrating the configuration of the information recording/reproducing device according to the first embodiment.

Figure 4:
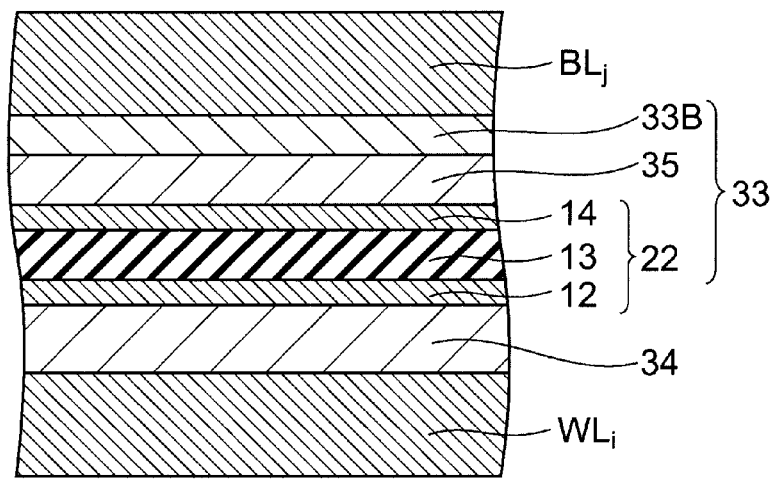
FIG. 4 is a schematic sectional view illustrating the configuration of the main part of the information recording/reproducing device according to the first embodiment.

FIG. 4 is a schematic sectional view illustrating the configuration of the main part of the information recording/reproducing device according to the first embodiment.

Figure 5:
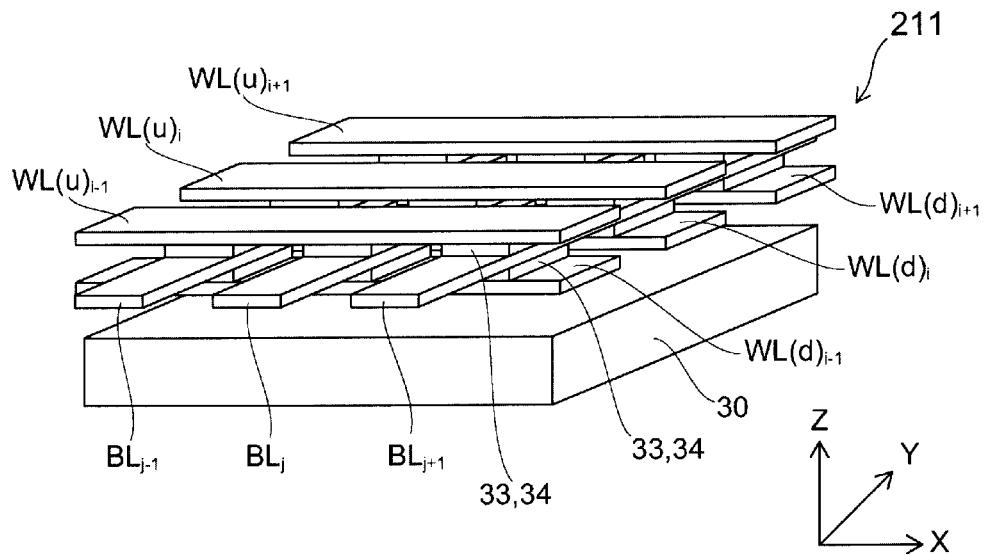
FIG. 5 is a schematic perspective view illustrating the configuration of an alternative information recording/reproducing device according to the first embodiment.

FIG. 5 is a schematic perspective view illustrating the configuration of an alternative information recording/reproducing device according to the first embodiment.

Figure 6:
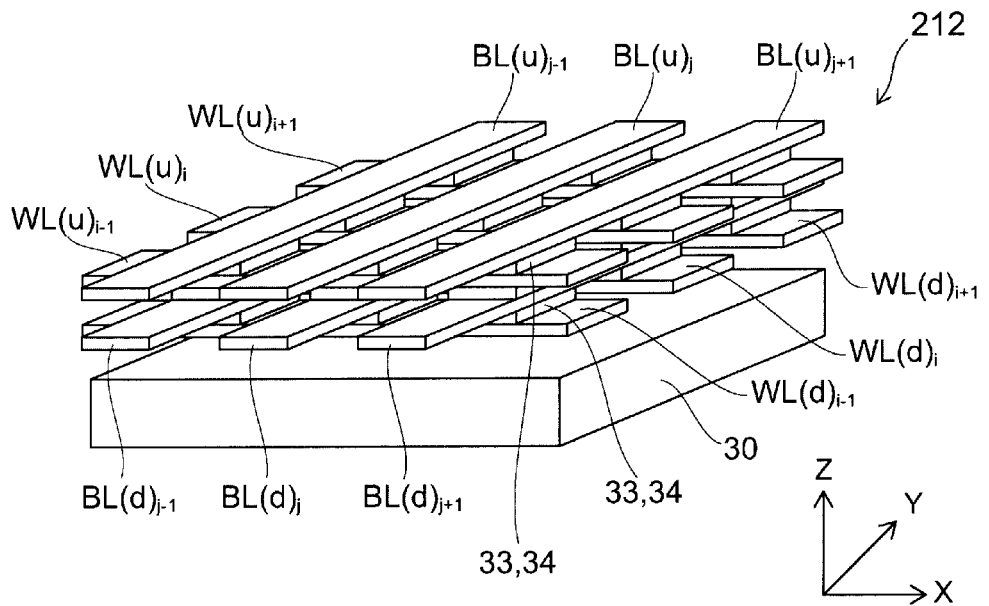
FIG. 6 is a schematic perspective view illustrating the configuration of an alternative information recording/reproducing device according to the first embodiment.

FIG. 6 is a schematic perspective view illustrating the configuration of an alternative information recording/reproducing device according to the first embodiment.

As shown in FIG. 1, the information recording/reproducing device 210 according to the first embodiment includes a recording layer 13. As described later, the information recording/reproducing device 210 further includes a driver section for producing state change in the recording layer 13 to record information by at least one of application of voltage to the recording layer 13 and passage of current to the recording layer 13.

The recording layer 13 exhibits state change between a high resistance state and a low resistance state by at least one of a voltage applied and a current passed from the driver section.

The information recording/reproducing device 210 can be e.g. an information recording/reproducing device of the cross-point type, an information recording/reproducing device of the probe memory type, or an information recording/reproducing device of the flash memory type.

First, the information recording/reproducing device 210 is described with reference to an information recording/reproducing device of the cross-point type.

As shown in FIGS. 2 and 3, in the information recording/reproducing device 210 according to the embodiment, striped first interconnects (word lines $WL_{i-1}$, $WL_i$, $WL_{i+1}$) extending in the X-axis direction are provided on the major surface of a substrate 30. Furthermore, striped second interconnects (bit lines $BL_{j-1}$, $BL_j$, $BL_{j+1}$) extending in the Y-axis direction orthogonal to the X-axis direction in a plane parallel to the substrate 30 are opposed to the first interconnects (word lines $WL_{i-1}$, $WL_i$, $WL_{i+1}$).

In the above example, the first interconnect and the second interconnect are orthogonal. However, the first interconnect and the second interconnect only need to be crossing (non-parallel).

As described above, a plane parallel to the major surface of the substrate 30 is taken as the X-Y plane. The extending direction of the first interconnect is taken along the X axis. An axis orthogonal to the X axis in the X-Y plane is taken as the Y axis. The direction perpendicular to the X axis and the Y axis is taken along the Z axis.

In the foregoing, the subscripts i and j are arbitrary. More specifically, although FIGS. 2 and 3 show an example including three first interconnects and three second interconnects, the embodiment is not limited thereto. The number of first interconnects and second interconnects is arbitrary. Furthermore, in the specific example, the first interconnect is a word line, and the second interconnect is a bit line. However, the first interconnect may be a bit line, and the second interconnect may be a word line. In the following description, it is assumed that the first interconnect is a word line and the second interconnect is a bit line.

As shown in FIGS. 2 and 3, a memory cell 33 is sandwiched between the first interconnect and the second interconnect. That is, in the information recording/reproducing device 210, a memory cell 33 is provided at the intersection between the bit line and the word line crossing three-dimensionally.

As shown in FIG. 3, for instance, one end of the word lines $WL_{i-1}$, $WL_i$, $WL_{i+1}$ is connected through a MOS transistor RSW as a select switch to a word line driver 31 having decoder functionality. One end of the bit lines $BL_{j-1}$, $BL_j$, $BL_{j+1}$ is connected through a MOS transistor CSW as a select switch to a bit line driver 32 having decoder and read functionality.

The gate of the MOS transistor RSW is inputted with a select signal $R_{i-1}$, $R_i$, $R_{i+1}$ for selecting one word line (row). The gate of the MOS transistor CSW is inputted with a select signal $C_{j-1}$, $C_j$, $C_{j+1}$ for selecting one bit line (column).

The memory cell 33 is located at the intersection of the word line $WL_{i-1}$, $WL_i$, $WL_{i+1}$ and the bit line $BL_{j-1}$, $BL_j$, $BL_{j+1}$. That is, the so-called cross-point cell array structure is implemented.

The memory cell 33 can be added with a rectifying element 34 for preventing sneak current during recording/reproduction.

Such a cross-point cell array structure is advantageous in increasing the integration density because there is no need to connect MOS transistors individually to memory cells 33.

As shown in FIG. 4, the memory cell 33 and the rectifying element 34 are provided between the word line $WL_i$ and the bit line $BL_j$. The vertical arrangement of the word line $WL_i$ and the bit line $BL_j$ is arbitrary. The arrangement of the memory cell 33 and the rectifying element 34 between the word line $WL_i$ and the bit line $BL_j$ is also arbitrary. More specifically, in the specific example illustrated in FIG. 4, the memory cell 33 is located closer to the bit line $BL_j$ than the rectifying element 34. However, the memory cell 33 may be located closer to the word line $WL_i$ than the rectifying element 34.

Furthermore, as shown in FIG. 4, the memory cell 33 includes a recording section 22. The recording section 22 includes a lower electrode 12, an upper electrode 14, and a recording layer 13 provided between the lower electrode 12 and the upper electrode 14.

Furthermore, besides the recording section 22, the memory cell 33 can include a protective layer 33B and a heater layer 35 provided between the recording section 22 and the protective layer 33B. In the specific example, the protective layer 33B is provided on the bit line $BL_j$ side of the recording section 22. However, the protective layer 33B may be provided on the word line $WL_i$ side of the recording section 22, or between the rectifying element 34 and the word line $WL_i$. Furthermore, the heater layer 35 and the protective layer 33B are provided as necessary, and can be omitted.

At least one of the lower electrode 12 and the upper electrode 14 of the recording section 22 can double as at least one of e.g. the word line $WL_i$, the rectifying element 34, the heater layer 35, the protective layer 33B, and the bit line $BL_j$ adjacent to the recording section 22, and can be omitted.

As shown in FIGS. 5 and 6, the stacked structure composed of the word line, the bit line, and the memory cell 33 sandwiched therebetween can be further stacked in a plurality to constitute information recording/reproducing devices 211, 212 having a three-dimensional structure.

In the information recording/reproducing devices 210, 211, 212 according to the embodiment having such structures, the word line driver 31 and the bit line driver 32 serving as a driver section perform at least one of application of voltage to the recording layer 13 and passage of current to the recording layer 13 through the word line $WL_i$ and the bit line $BL_j$. Thus, state change is produced in the recording layer 13 to record information. For instance, the driver section records information by applying voltage to the recording layer 13 and producing state change in the recording layer 13. Furthermore, the recorded information can be read out.

As shown in FIG. 1, the recording section 22 of the information recording/reproducing device 210 according to the embodiment includes a recording layer 13. In the recording section 22 of the specific example, the recording layer 13 is provided between the lower electrode 12 and the upper electrode 14. However, as described above, the lower electrode 12 and the upper electrode 14 can be omitted. In the following, for simplicity of description, it is assumed that the lower electrode 12 and the upper electrode 14 are provided.

In the specific example, the recording layer 13 is made of a first layer 81 including a first compound 71. However, as described later, the recording layer 13 may have a stacked structure of a first layer 81 and a layer different from the first layer 81. In the following description, first, the recording layer 13 made of a first layer 81 is described.

The first layer 81 constituting the recording layer 13 includes a first compound 71.

The first compound 71 is a mixed crystal of a plurality of kinds of binary oxide crystals taking the same crystal structure. More specifically, the first compound 71 is a mixed crystal of $MO_x$ and $NO_x$. $MO_x$ and $NO_x$ each independently take certain crystal structures, and these crystals have the same structure. Here, M (first metallic element 51) and N (second metallic element 52) are different kinds of metallic elements.

For instance, if M is divalent, then x is 1, and $MO_x$ is MO. For instance, if M is trivalent, then x is 3/2, and $MO_x$ is $M_2O_3$. If M is tetravalent, then $MO_x$ is $MO_2$. The same also applies to $NO_x$.

That is, the first compound 71 is composed of the first metallic element 51, the second metallic element 52, and oxygen 61.

The oxide formed from the second metallic element 52 has the same crystal structure as the oxide of the first metallic element 51. The first compound 71 has the same crystal structure as the oxide of the first metallic element 51.

More specifically, examples of $MO_x$ and $NO_x$ include NiO, CoO, MnO, FeO, TaO, NbO, TiO, VO, MgO, CaO, and BaO taking the rock-salt structure, $Fe_2O_3$, $Cr_2O_3$, $Ti_2O_3$, $V_2O_3$, $Al_2O_3$, and $Ga_2O_3$ taking the corundum structure, $Mn_2O_3$ and $Y_2O_3$ taking the C-rare earth structure, and $TiO_2$, $MnO_2$, $CrO_2$, $MoO_2$, $NbO_2$, $WO_2$, $TaO_2$, $IrO_2$, $RuO_2$, $SnO_2$, $GeO_2$, and $PbO_2$ taking the rutile structure.

With regard to the composition of M (first metallic element 51) and N (second metallic element 52) in the mixed crystal, the composition of the element having a smaller ionic radius of the M ion and N ion in the mixed crystal is set to yc or more. Here, yc is the percolation threshold of the lattice structure formed by metal ions (M ions and N ions) in the crystal structure of the mixed crystal.

For instance, denoting the mixed crystal of $MO_x$ and $NO_x$ by $M_yN_{1-y}O_x$, if the ionic radius of the M ion in the mixed crystal is smaller than the ionic radius of the N ion, then y is set to $y \geq yc$.

More specifically, the mixed crystal having the rock-salt structure is expressed as $M_yN_{1-y}O$. Here, divalent M ions and divalent N ions form a face-centered cubic lattice. The percolation threshold of the face-centered cubic lattice is 0.199. Hence, the composition of the element having a smaller ionic radius of the M ion and N ion in the mixed crystal $M_yN_{1-y}O$ of the rock-salt structure is set to 0.199 or more.

Here, for simplicity, the composition ratio of the metal ions (M ions and N ions) and oxygen ions is expressed as 1:1 ($M_yN_{1-y}O$). However, slight surplus or deficit of oxygen ions is allowed as long as the rock-salt structure is maintained. That is, the rock-salt structure may be expressed as $M_yN_{1-y}O_{1\pm\delta}$ (where δ is sufficiently smaller than 1).

Here, for instance, the first metallic element 51 can be at least one of Ni, Co, Fe, Mn, Ti, and V, which are transition elements. On the other hand, for instance, the second metallic element 52 can be Mg, which is a main group element. The ionic radii of $Ni^{2+}$, $Co^{2+}$, $Fe^{2+}$, $Mn^{2+}$, $Ti^{2+}$, $V^{2+}$, and $Mg^{2+}$ are 0.69, 0.65, 0.61, 0.83, 0.86, 0.79, and 0.72 angstroms, respectively.

Here, the first metallic element 51 and the second metallic element 52 may be both transition elements, and two kinds of elements selected from the group consisting of Ni, Co, Fe, Mn, Ti, and V.

For instance, in the case of a mixed crystal $Ni_yMg_{1-y}O$ taking the rock-salt structure, the $Ni^{2+}$ ion has a smaller ionic radius than the $Mg^{2+}$ ion in the mixed crystal. Hence, the composition y of Ni is set to $y \geq 0.199$.

In the case of a mixed crystal $Co_yMg_{1-y}O$ taking the rock-salt structure, the $Co^{2+}$ ion has a smaller ionic radius than the $Mg^{2+}$ ion in the mixed crystal. Hence, the composition y of Co is set to $y \geq 0.199$.

In the case of a mixed crystal $Co_yNi_{1-y}O$ taking the rock-salt structure, the $Co^{2+}$ ion has a smaller ionic radius than the $Ni^{2+}$ ion in the mixed crystal. Hence, the composition y of Co is set to $y \geq 0.199$.

Furthermore, for instance, the mixed crystal having the rutile structure is expressed as $(M_yN_{1-y})O_2$. Here, tetravalent M ions and tetravalent N ions form a body-centered cubic lattice. The percolation threshold of the body-centered cubic lattice is 0.245. Hence, the composition of the element having a smaller ionic radius of the M ion and N ion in the mixed crystal $(M_yN_{1-y})O_2$ of the rutile structure is set to 0.245 or more.

Here, for simplicity, the composition ratio of the metal ions (M ions and N ions) and oxygen ions is expressed as 1:2 $((M_yN_{1-y})O_2)$. However, slight surplus or deficit of oxygen ions is allowed as long as the rutile structure is maintained.

That is, the rutile structure may be expressed as $(M_yN_{1-y})O_{2\pm\delta}$ (where $\delta$ is sufficiently smaller than 1).

Here, for instance, at least one of the first metallic element 51 and the second metallic element 52 can be at least one of Ti, Mn, Cr, Mo, Nb, W, Ta, Ir, and Ru, which are transition elements. On the other hand, at least one of the first metallic element 51 and the second metallic element 52 can be one of Sn, Ge, and Pb, which are main group elements. The ionic radii of $Ti^{4+}$, $Mn^{4+}$, $Cr^{4+}$, $Mo^{4+}$, $Nb^{4+}$, $W^{4+}$, $Ta^{4+}$, $Ir^{4+}$, $Ru^{4+}$, $Sn^{4+}$, $Ge^{4+}$, and $Pb^{4+}$ are 0.61, 0.53, 0.55, 0.65, 0.68, 0.66, 0.68, 0.63, 0.62, 0.69, 0.53, and 0.78 angstroms, respectively.

Furthermore, for instance, the mixed crystal having the C-rare earth structure is expressed as $(M_yN_{1-y})_2O_3$. Here, trivalent M ions and trivalent N ions form a face-centered cubic lattice. The percolation threshold of the face-centered cubic lattice is 0.199. Hence, the composition of the element having a smaller ionic radius of the M ion and N ion in the mixed crystal $(M_yN_{1-y})_2O_3$ of the C-rare earth structure is set to 0.199 or more.

Here, for simplicity, the composition ratio of the metal ions (M ions and N ions) and oxygen ions is expressed as 2:3 $((M_yN_{1-y})_2O_3)$. However, slight surplus or deficit of oxygen ions is allowed as long as the C-rare earth structure is maintained. That is, the C-rare earth structure may be expressed as $(M_yN_{1-y})_2O_{3\pm\delta}$ (where $\delta$ is sufficiently smaller than 1).

Here, for instance, at least one of the first metallic element 51 and the second metallic element 52 can be Mn, which is a transition element. On the other hand, at least one of the first metallic element 51 and the second metallic element 52 can be Y, which is a main group element. The ionic radii of $Mn^{3+}$ and $Y^{3+}$ are 0.58 and 0.90 angstroms, respectively.

Furthermore, for instance, the mixed crystal having the corundum structure is expressed as $(M_yN_{1-y})_2O_3$. Here, trivalent M ions and trivalent N ions partially occupy ⅔ of a face-centered cubic lattice. In this case, the coordination number is ⅔ of the coordination number of the face-centered cubic lattice, 12. That is, the coordination number in this case is 8. Thus, the percolation threshold in this case can be set to that of the body-centered cubic lattice (coordination number 8), 0.245. Hence, the composition of the element having a smaller ionic radius of the M ion and N ion in the mixed crystal $(M_yN_{1-y})_2O_3$ of the corundum structure is set to 0.245 or more.

Here, for simplicity, the composition ratio of the metal ions (M ions and N ions) and oxygen ions is expressed as 2:3 $((M_yN_{1-y})_2O_3)$. However, slight surplus or deficit of oxygen ions is allowed as long as the corundum structure is maintained. That is, the corundum structure may be expressed as $(M_yN_{1-y})_2O_{3\pm\delta}$ (where $\delta$ is sufficiently smaller than 1).

Here, for instance, at least one of the first metallic element 51 and the second metallic element 52 can be at least one of Ti, Cr, Fe, and V, which are transition elements. On the other hand, at least one of the first metallic element 51 and the second metallic element 52 can be one of Al and Ga, which are main group elements. The ionic radii of $Ti^{3+}$, $Cr^{3+}$, $Fe^{3+}$, $V^{3+}$, $Al^{3+}$, and $Ga^{3+}$ are 0.67, 0.62, 0.55, 0.64, 0.54, and 0.62 angstroms, respectively.

The above percolation thresholds are described in, e.g., "Introduction to Percolation Theory", Stauffer, D. and Aharony, A., London: Taylor & Francis, 1992. The above ionic radii are described in, e.g., R. D. Shannon, Acta Cryst., Vol. A32, pp. 751-767 (1976).

Thus, the first oxide of the first metallic element 51 and the second oxide of the second metallic element 52 have the same crystal structure. Hence, for instance, the crystal structure is less affected by migration of at least one of the first metallic element 51 and the second metallic element 52 due to voltage applied or current passed to the recording layer 13. Thus, migration of these elements requires only low energy. Consequently, the power consumption can be reduced.

The metal ion transferred by voltage application is the ion having a smaller ionic radius in the mixed crystal. Here, the composition y of the ion having a smaller ionic radius is greater than or equal to the percolation threshold yc. This ensures that the recording layer 13 includes not a few continuous linkages of ions having a smaller ionic radius, i.e., trains of nearest neighbor metal ions having a smaller ionic radius from the upper end to the lower end of the recording layer 13. Hence, by voltage application, the ion having a smaller ionic radius can easily migrate in the recording layer 13.

Furthermore, under voltage application or current passage to the recording layer 13, the crystal structure is left substantially unchanged. Hence, the recording layer 13 is thermally stable. This can enhance the stability in repeated operation.

That is, resistance change with low power consumption is achieved by facilitating migration of cations. On the other hand, to improve thermal stability of each resistance state, it is important to stably maintain the state after migration of cations.

In the information recording/reproducing device 210 according to the embodiment, the recording layer 13 is made of an oxide material having a crystal structure suitable to facilitate migration of cations and to stably maintain the structure after the migration of cations. That is, the recording layer 13 is made of a mixed crystal of a plurality of kinds of binary oxide crystals having the same crystal structure.

Thus, the information recording/reproducing device 210 according to the embodiment can provide a nonvolatile information recording/reproducing device having low power consumption and high stability in repeated operation.

In the information recording/reproducing device 210 according to the embodiment, at least one of the first metallic element 51 and the second metallic element 52 can be a transition element of Groups 4-11.

More specifically, at least one of the first metallic element 51 and the second metallic element 52 can be at least one selected from the group consisting of Ni, Co, Fe, Mn, Ti, V, Cr, Ta, Nb, Mo, and W.

Furthermore, one of the first metallic element 51 and the second metallic element 52 can be one of main group elements. More specifically, one of the first metallic element 51 and the second metallic element 52 can be at least one selected from the group consisting of Mg, Sn, Ge, Pb, Al, Ga, and Y.

In the following, an example of the operating mechanism of the information recording/reproducing device 210 according to the embodiment is described.

Figure 7:
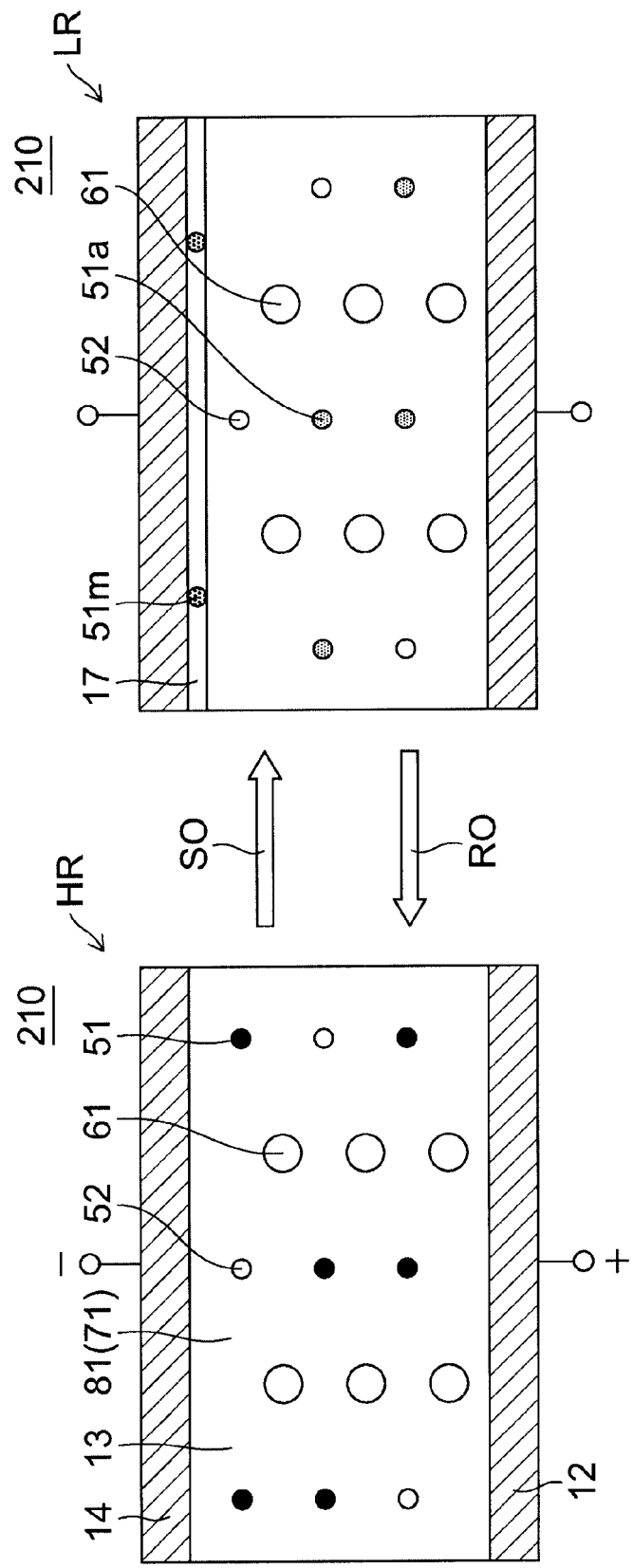
FIG. 7 is a schematic sectional view illustrating the operation of the information recording/reproducing device according to the first embodiment.

FIG. 7 is a schematic sectional view illustrating the operation of the information recording/reproducing device according to the first embodiment.

As shown in FIG. 7, the recording layer 13 has a state of relatively high resistivity (high resistance state HR) and a state of relatively low resistivity (low resistance state LR).

In the following description, it is assumed that the initial state (reset state) of the recording layer 13 is the high resistance state HR.

By a potential gradient provided to the recording layer 13, state change is produced in the recording layer 13. Thus, the recording layer 13 is turned to the low resistance state LR (set state) to record information.

For instance, a voltage is applied to the recording layer 13 to produce a potential gradient in the recording layer 13. Then, for instance, some ions of at least one of the first metallic element 51 and the second metallic element 52 migrate in the recording layer 13.

More specifically, of the first metallic element 51 and the second metallic element 52, for instance, primarily the element having a smaller ionic radius migrates. Here, for instance, it is assumed that the ion of the first metallic element 51 has a smaller ionic radius than the ion of the second metallic element 52. That is, it is assumed that primarily the first metallic element 51 migrates in the recording layer 13.

Then, for instance, by selecting the kind of the second metallic element 52, migration of ions of the second metallic element 52 can be suppressed.

Here, the recording layer 13 is made of a mixed crystal of two kinds of binary oxide crystals having the same crystal structure. Hence, by the presence of ions of the second metallic element 52 not migrating under voltage application, the crystal structure before voltage application is maintained despite partial deficiency of ions of the first metallic element 51.

First, for instance, the state of the upper electrode 14 placed at a relatively lower potential than the lower electrode 12 is created. For instance, the lower electrode 12 is placed at a fixed potential (e.g., ground potential), and the upper electrode 14 is applied with a negative potential.

Then, some ions of the first metallic element 51 in the recording layer 13 migrate toward the upper electrode (cathode) 14. Thus, ions of the first metallic element 51 in the recording layer (crystal) 13 are decreased relative to O (oxygen) ions. The ions of the first metallic element 51 having migrated toward the upper electrode 14 receive electrons from the upper electrode 14 and are deposited as first metal atoms (first metal 51$m$). Thus, a metal layer 17 having high conductivity is formed.

Hence, in the region near the upper electrode 14, ions of the first metallic element 51 are reduced to behave like a metal. This significantly decreases the electrical resistance of the region.

On the other hand, inside the recording layer 13, O ions become excessive. As a result, to maintain the electrical neutrality condition, for instance, the average valence of transition metal ions of at least one of the second metallic element 52 and the first metallic element 51 is increased. Here, as an example, it is assumed that the first metallic element 51 is a transition metal and its valence is variable. Thus, the ion of the first metallic element 51 is a variable-valence ion 51$a$.

Here, the first metallic element 51 is selected so that the electrical resistance decreases with the increase of its valence. Then, by migration of ions of the first metallic element 51, the electrical resistance decreases in both the metal layer 17 and the recording layer 13. Hence, the state of the recording layer 13 as a whole changes from the high resistance state HR to the low resistance state LR.

Thus, the operation of recording information, i.e., the set operation SO, is performed.

On the other hand, reproduction of the recorded information is performed by, e.g., applying a voltage pulse to the recording layer 13 to detect the resistance value of the recording layer 13. The magnitude of this voltage pulse is set to a small value such as not to cause migration of ions of the first metallic element 51.

The above process is a kind of electrolysis. It can be considered that an oxidizing agent is produced by electrochemical oxidation on the lower electrode (anode) 12 side, whereas a reducing agent is produced by electrochemical reduction on the upper electrode (cathode) 14 side.

The reset operation RO for returning the low resistance state LR to the high resistance state HR can be performed by, e.g., passing a large current in the recording layer 13 to heat the recording layer 13 by the generated Joule heat. This accelerates the redox reaction of the recording layer 13. That is, by the Joule heat due to the large current pulse, ions of the first metallic element 51 return into the thermally more stable crystal structure (recording layer 13). Thus, the high resistance state HR occurs.

As an alternative method, the reset operation RO can also be performed by applying the recording layer 13 with a voltage pulse of opposite polarity to that in the set operation SO. More specifically, as in the set operation SO, the lower electrode 12 is placed at a fixed potential, and the upper electrode 14 is applied with a positive potential. Then, the first metal 51$m$ near the upper electrode 14 gives an electron to the upper electrode 14 and turns into an ion of the first metallic element 51. Then, the ion returns into the crystal structure (recording layer 13) by the potential gradient in the recording layer 13. Thus, the valence of the variable-valence ion 51$a$ of the first metallic element 51, whose average valence has been increased, decreases to the initial value. Hence, the state changes to the high resistance state HR.

Here, in order to avoid the reset operation RO at room temperature, i.e., to ensure sufficiently long retention time, the first metallic element 51 is selected so as to have an appropriate ionic radius and valence.

Power consumption in at least one of the set operation SO and the reset operation RO can be effectively reduced by forming the ion migration path of the first metallic element 51 so that ions of the first metallic element 51 can easily migrate inside the recording layer (crystal) 13 without destroying the crystal.

Thermal stability of each resistance state can be effectively improved by stably maintaining the state after migration of ions of the first metallic element 51.

In the information recording/reproducing device 210 according to the embodiment, the recording layer 13 is made of a mixed crystal of two kinds of binary oxide crystals having the same crystal structure. Hence, ions of the second metallic element 52 not migrating under voltage application are stably present. Thus, the crystal structure before voltage application is maintained despite partial deficiency of ions of the first metallic element 51 due to migration of the ions of the first metallic element 51. This enables intercalation and disintercalation of ions of the first metallic element 51 into the recording layer 13 without crystal destruction. That is, a migration path for facilitating migration of ions of the first metallic element 51 is formed. As a result, the power consumption is reduced.

Furthermore, because the crystal structure before voltage application is maintained despite partial deficiency of ions of the first metallic element 51 due to migration of the ions of the first metallic element 51, thermal stability of each resistance state is improved.

Thus, the information recording/reproducing device 210 according to the embodiment can provide a nonvolatile information recording/reproducing device having low power consumption and high stability in repeated operation.

In the foregoing description, ions of the first metallic element 51, which is a transition metal, migrate under voltage application, whereas ions of the second metallic element 52 are substantially immobile. However, the opposite is also possible.

For instance, the combination of the first metallic element 51 and the second metallic element 52 may be selected so that under voltage application, ions of the first metallic element 51 are substantially immobile, whereas ions of the second metallic element 52 migrate. In this case, the average valence of ions of the first metallic element 51 in the recording layer 13 is varied due to migration of ions of the second metallic element 52. This changes the resistance of the recording layer 13.

Also in this case, the first oxide of the first metallic element 51 and the second oxide of the second metallic element 52 have the same crystal structure. Hence, the crystal structure is less affected by migration of the second metallic element 52. That is, migration of cations is facilitated, and the state after migration of cations can be stably maintained.

That is, the recording layer 13 is made of a mixed crystal of a plurality of kinds of binary oxide crystals having the same crystal form. Thus, migration of cations is facilitated, and the structure after migration of cations can be stably maintained.

In the foregoing description, the resistance of the recording layer 13 is decreased by the increase of average valence of ions of the first metallic element 51 in the recording layer 13 due to migration of ions of the first metallic element 51 or the second metallic element 52, which is a transition metal. However, the opposite is also possible. For instance, depending on the average valence of ions of the first metallic element 51 in the initial state determined by the crystal structure of the recording layer 13, the first metallic element 51 can be selected so that the resistance of the recording layer 13 is increased by the increase of average valence of ions of the first metallic element 51 due to ion migration. In this case, the initial state can be used as the low resistance state LR, and the state after ion migration can be used as the high resistance state HR.

Specifically, at least one of the first metallic element 51 and the second metallic element 52 is, e.g., a transition element of Groups 4-11. Thus, the electrical resistance changes when its valence increases. More specifically, at least one of the first metallic element 51 and the second metallic element 52 is at least one selected from the group consisting of Ni, Co, Fe, Mn, Ti, V, Cr, Ta, Nb, Mo, and W. Thus, the electrical resistance changes when its valence increases.

More specifically, the transition metal ion in the mixed crystal can be divalent (in the case of $M_yN_{1-y}O$). For instance, the mixed crystal can be of the rock-salt structure. For $Ni^{2+}$, $Co^{2+}$, $Mn^{2+}$, and $Fe^{2+}$, if the average valence increases from divalence, the resistance of the recording layer 13 decreases. On the other hand, for $Ti^{2+}$ and $V^{2+}$, if the average valence increases from divalence, the resistance of the recording layer 13 increases. In the case of including a plurality of transition metal ions whose resistances are changed oppositely by the increase of average valence, the composition of the transition metal ions determines whether the resistance of the recording layer 13 decreases or increases.

Furthermore, the transition metal ion in the mixed crystal can be trivalent (in the case of $(M_yN_{1-y})_2O_3$). For instance, the mixed crystal can be of the corundum structure or the C-rare earth structure. For $Fe^{3+}$, if the average valence increases from trivalence, the resistance of the recording layer 13 decreases.

Furthermore, the transition metal ion in the mixed crystal can be tetravalent (in the case of $(M_yN_{1-y})O_2$). For instance, the mixed crystal can be of the rutile structure. For $Nb^{4+}$, $W^{4+}$, and $Ta^{4+}$, if the average valence increases from tetravalence, the resistance of the recording layer 13 increases.

The above transition metal ions are illustrative only, and the embodiment is not limited thereto. In the foregoing, for simplicity, the composition ratio of the metal ions (M ions and N ions) and oxygen ions is an integer ratio, and the initial valence of the transition metal ion is an integer. However, slight surplus or deficit of oxygen ions is allowed as long as the structure of the mixed crystal is maintained. Hence, the initial average valence of the transition metal ion may be a non-integer value.

On the other hand, the second metallic element 52 can be a main group element having a valence nearest to the valence of the first metallic element 51. This can facilitate satisfying the electrical neutrality condition after migration of ions of the second metallic element 52.

In the case where the first metallic element 51 is at least one selected from the group consisting of Ni, Co, Mn, Ti, and V, the second metallic element 52 can be Mg.

Thus, the information recording/reproducing device 210 according to the embodiment can provide a nonvolatile information recording/reproducing device having low power consumption and high stability in repeated operation.

Thus, in the information recording/reproducing device 210 according to the embodiment, the valence of at least one of the first metallic element 51 and the second metallic element 52 is varied so as to satisfy the electrical neutrality condition of the first compound 71 constituting the recording layer 13. By means of resistance change associated with the variation of valence, the recording layer 13 changes between the high resistance state HR and the low resistance state LR.

However, the foregoing is an example of the operating mechanism of the information recording/reproducing device 210 according to the embodiment. The operation can be based on other operating mechanisms. Also in this case, the first compound 71 constituting the recording layer 13 can be a mixed crystal of two kinds of binary oxide crystals having the same crystal structure. The leads to a stable crystal structure, and hence enhances the stability in repeated operation. Furthermore, different metallic elements are contained in the thermally stable crystal structure. This decreases the energy of transition between the high resistance state HR and the low resistance state LR. Thus, the power consumption can be reduced.

In the foregoing, the initial state (reset state) is the high resistance state HR, and the changed state (set state) is the low resistance state LR. However, this definition only intends to simplify the description. Depending on the choice and manufacturing method of materials, this definition may be reversed. That is, the initial state (reset state) may be the low resistance state LR, and the changed state (set state) may be the high resistance state HR. That is, in the information recording/reproducing device 210 according to the embodiment, the magnitude relation of resistance between the reset (initial) state and the set state is arbitrary.

In the information recording/reproducing device 210 according to the embodiment, of the first metallic element 51 and the second metallic element 52, the composition ratio of the element having a smaller ionic radius is set to 40% or more. That is, the ratio of the amount of the element having a smaller ionic radius to the total amount of the first metallic element 51 and the second metallic element 52 is set to 40% or more. Conversely, the composition ratio of the element having a larger ionic radius, i.e., the ratio of the amount of the element having a larger ionic radius to the total amount of the first metallic element 51 and the second metallic element 52, is set to less than 60%.

The element having a smaller ionic radius of the first metallic element 51 and the second metallic element 52 is an element migrating more easily. In the information recording/reproducing device 210 according to the embodiment, the composition of the element having a smaller ionic radius is set to 40% or more. Thus, as described below, the driving voltage can be controlled to an appropriate range, and a more practical information recording/reproducing device is obtained.

For instance, the first metallic element 51 of the first compound 71 can be Ni, and the second metallic element 52 can be Mg. In this case, the element having a smaller ionic radius is Ni, and primarily migrates.

In this case, when some Ni ions migrate, the average valence of Ni ions left in the recording layer increases from approximately divalence, and the resistance of the recording layer decreases. That is, the recording layer changes from the high resistance state HR to the low resistance state LR.

In this case, the driving voltage is made appropriate when the composition ratio of Ni, i.e., the ratio of the amount of Ni to the amount of (Ni+Mg), is 40% or more.

Figure 8:
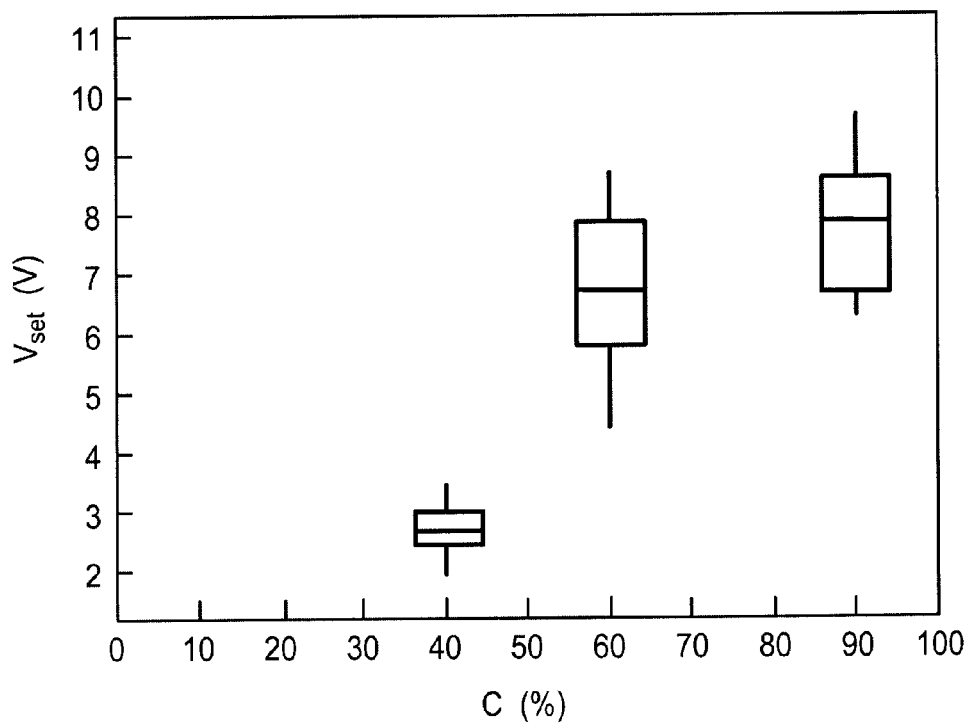
FIG. 8 is a graph illustrating the characteristics of the information recording/reproducing device according to the first embodiment.

FIG. 8 is a graph illustrating the characteristics of the information recording/reproducing device according to the first embodiment.

More specifically, this figure illustrates the result of evaluating the characteristics of the information recording/reproducing device in which the first compound 71 is an Ni—Mg—O crystal with the ratio of Ni and Mg varied. The horizontal axis represents the composition ratio C of Mg. The vertical axis represents the set voltage Vset for transition from the high resistance state HR to the low resistance state LR.

As shown in FIG. 8, with the increase of the composition ratio C of Mg, the voltage Vset increases. The relationship between the composition ratio C of Mg and the set voltage Vset is not linear. For instance, the set voltage Vset is relatively small when the composition ratio C of Mg is 40%. However, the set voltage Vset significantly increases when the composition ratio C exceeds 60%.

In the information recording/reproducing device 210 according to the embodiment, the practical range of the set voltage Vset is approximately 7 V or less. Also in this respect, the composition ratio C of Mg is preferably smaller than 60%.

That is, the composition ratio of Ni is preferably 40% or more.

Thus, in the information recording/reproducing device 210 according to the embodiment, the composition ratio of the element having a smaller ionic radius of the first metallic element 51 and the second metallic element 52 is preferably 40% or more.

Here, for instance, the set voltage Vset for transition from the high resistance state HR to the low resistance state LR can be decreased and controlled to a practical range. This makes it possible to provide a nonvolatile information recording/reproducing device having low power consumption and high stability in repeated operation, and being more practical.

Second Embodiment

Figure 9:
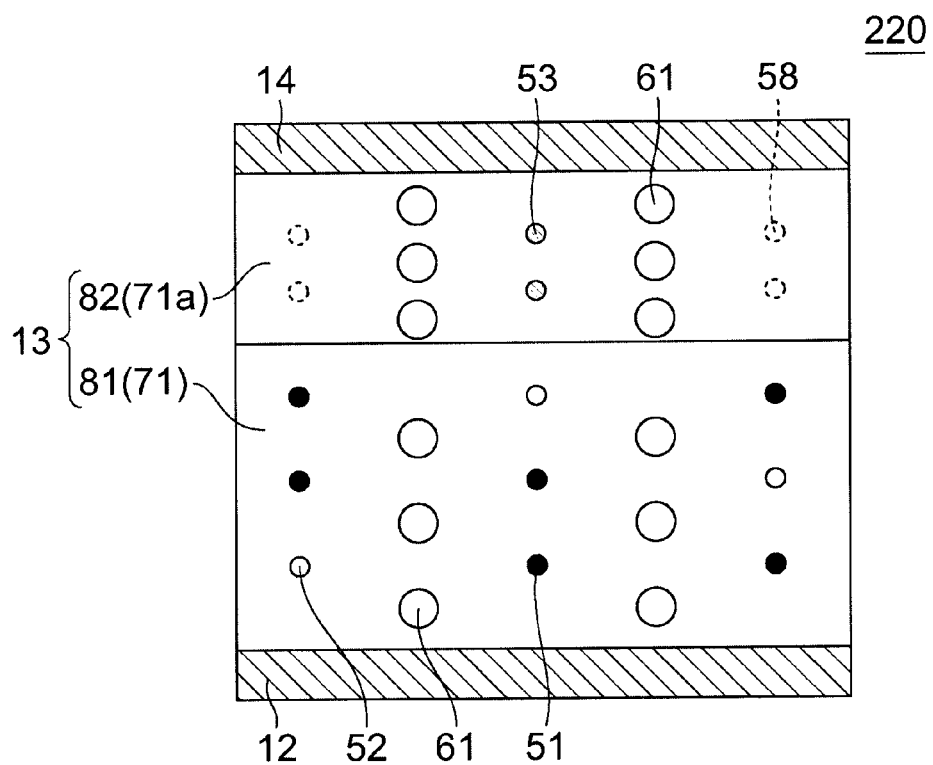
FIG. 9 is a schematic sectional view illustrating the configuration of the main part of an information recording/reproducing device according to a second embodiment.

FIG. 9 is a schematic sectional view illustrating the configuration of the main part of an information recording/reproducing device according to a second embodiment.

As shown in FIG. 9, in the information recording/reproducing device 220 according to the second embodiment, the recording layer 13 further includes a second layer 82 provided in contact with the first layer 81. The second layer 82 includes vacant sites 58 capable of containing cations (ions of at least one of the first metallic element 51 and the second metallic element 52). In the specific example illustrated in FIG. 9, the second layer 82 includes ions of oxygen 61, ions of a metallic element 53, and vacant sites 58.

Otherwise, the information recording/reproducing device 220 can be made similar to the information recording/reproducing device 210 according to the first embodiment, and the description thereof is omitted.

In the information recording/reproducing device 220 according to the embodiment, the second layer 82 including a second compound 72 is provided adjacent to the first layer 81. The second compound 72 can contain cations (ions of at least one of the first metallic element 51 and the second metallic element 52) introduced by at least one of migration and diffusion from the first layer 81. Thus, advantageously, migrating/diffusing cations are stably contained therein. Compounds suitably used as such a second compound 72 are as follows.

The vacant site 58 to be occupied by an ion of at least one of the first metallic element 51 and the second metallic element 52 is herein denoted by □. Then, examples of the second compound 72 include those expressed by the following chemical formulas. Some vacant sites 58 may be previously occupied by other ions to facilitate film formation of the second compound 72.

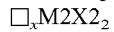
$\square_x M2X2_2$

Here, M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I.

The mole ratio x is set to satisfy $0.3 \leq x \leq 1$.

$\square_x M2X2_3$

Here, M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I.

The mole ratio x is set to satisfy $1 \leq x \leq 2$.

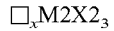
$\square_x M2X2_4$

Here, M2 is at least one element selected from the group consisting of Ti, Ge, Sn, V, Cr, Mn, Fe, Co, Ni, Nb, Ta, Mo, W, Re, Ru, and Rh.

X2 is at least one element selected from the group consisting of O, S, Se, N, Cl, Br, and I.

The mole ratio x is set to satisfy $1 \leq x2$.

$\square_x M2PO_z$

Here, M2 is at least one element selected from the group consisting of Ti, Ge, Sn, V, Cr, Mn, Fe, Co, Ni, Nb, Ta, Mo, W, Re, Ru, and Rh.

P is the phosphorus element, and O is the oxygen element.

The mole ratios x and z are set to satisfy $0.3 \leq x \leq 3$ and $4 \leq z \leq 6$.

$\square_x M2O_5$

Here, M2 is at least one element selected from the group consisting of V, Cr, Mn, Fe, Co, Ni, Nb, Ta, Mo, W, Re, Ru, and Rh.

O is the oxygen element.

The mole ratio x is set to satisfy $0.3 \leq x \leq 2$.

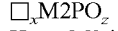

The second compound 72 preferably has a structure including at least one selected from the group consisting of the hollandite structure, ramsdellite structure, anatase structure, brookite structure, pyrolusite structure, $ReO_3$ structure, $MoO_{1.5}PO_4$ structure, $TiO_{0.5}PO_4$ structure, $FePO_4$ structure, $\beta MnO_2$ structure, $\gamma MnO_2$ structure, $\lambda MnO_2$ structure, spinel structure, and ilmenite structure. In particular, most preferably, the second compound 72 has the same ilmenite structure as the first compound 71.

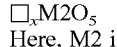

The electron Fermi level of the first layer 81 is made lower than the electron Fermi level of the second layer 82. This is one of the preferable conditions to impart reversibility to the state of the recording layer 13. Here, all the Fermi levels are measured from the vacuum level.

Such combinations of materials are used in the recording layer 13 to facilitate ion exchange between the first layer 81 and the second layer 82. This can reduce the power consumption required for resistance change and enhance thermal stability.

Figure 10:
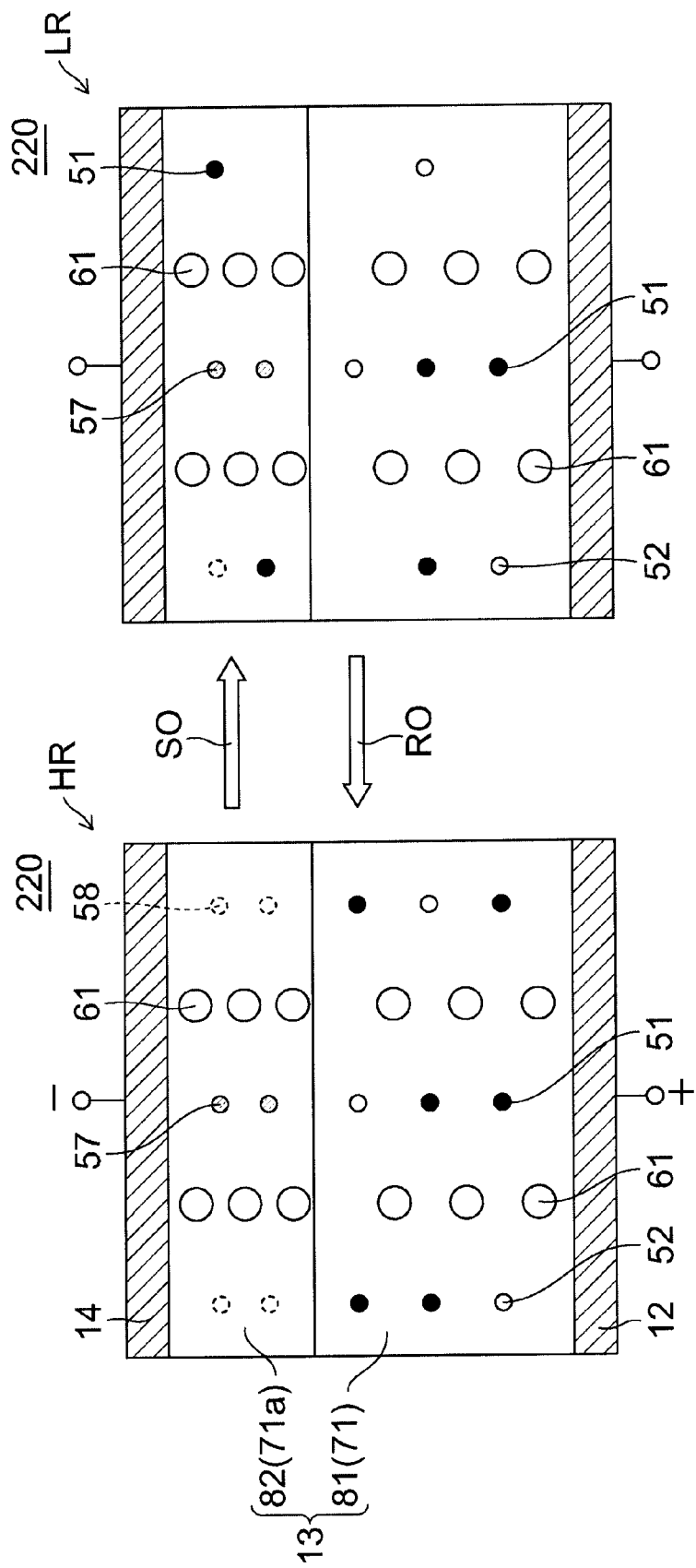
FIG. 10 is a schematic sectional view illustrating the operation of the information recording/reproducing device according to the second embodiment.

FIG. 10 is a schematic sectional view illustrating the operation of the information recording/reproducing device according to the second embodiment.

As shown in FIG. 10, in the information recording/reproducing device 220 according to the embodiment, the recording layer 13 includes a first layer 81 and a second layer 82. In the high resistance state HR, a voltage is applied to the recording layer 13 to produce a potential gradient in the recording layer 13. Then, some cations (e.g., ions of the first metallic element 51) migrate in the crystal (in the first layer 81). The cation is then contained and stabilized in the vacant site 58 of the second layer 82.

Thus, the alternative information recording/reproducing device 220 according to the embodiment can be operated more stably because the recording layer 13 includes a second layer 82.

In the information recording/reproducing device according to the embodiment, the recording layer 13 may have a structure in which a plurality of the aforementioned first layers 81 and second layers 82 are alternately stacked.

Third Embodiment

A third embodiment is an information recording/reproducing device of the probe memory type.

Figure 11:
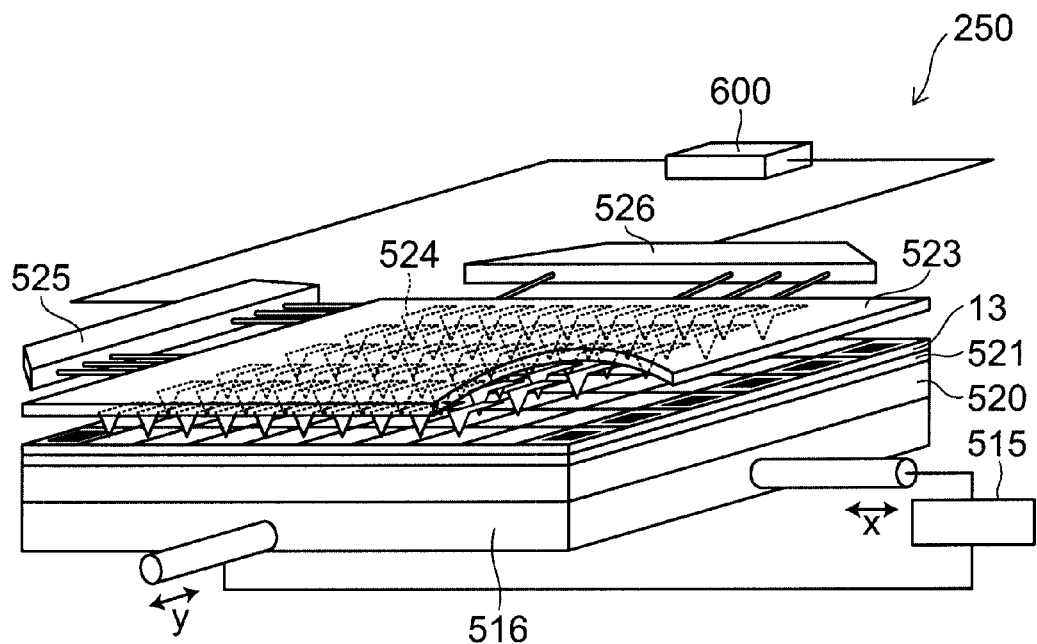
FIG. 11 is a schematic perspective view illustrating the configuration of an information recording/reproducing device according to a third embodiment.

FIG. 11 is a schematic perspective view illustrating the configuration of the information recording/reproducing device according to the third embodiment.

Figure 12:
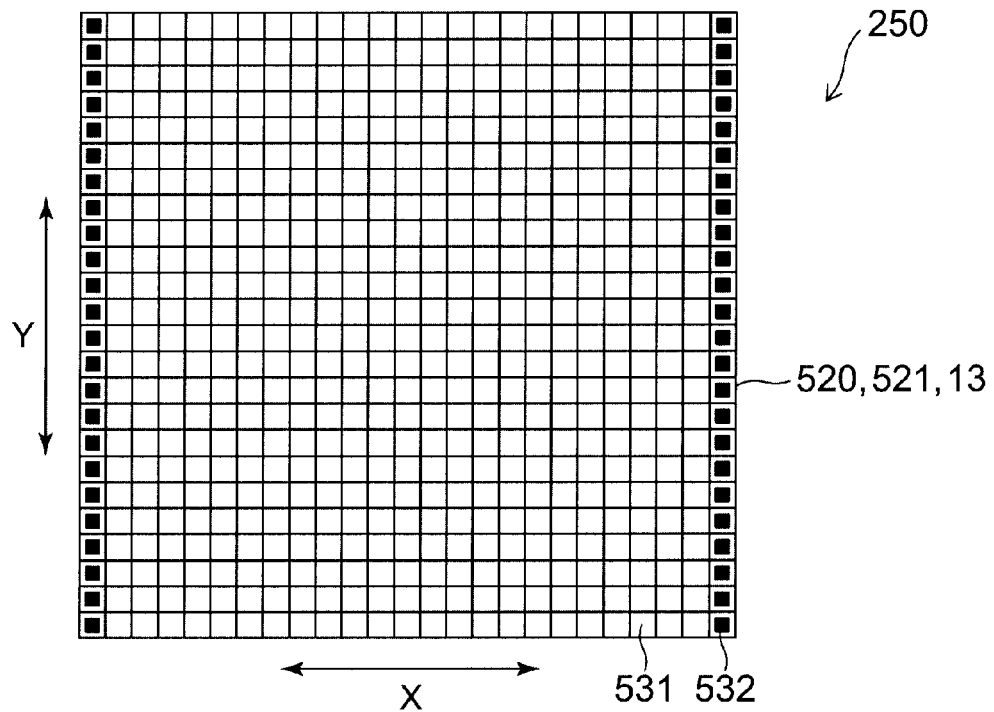
FIG. 12 is a schematic plan view illustrating the configuration of the information recording/reproducing device according to the third embodiment.

FIG. 12 is a schematic plan view illustrating the configuration of the information recording/reproducing device according to the third embodiment.

As shown in FIGS. 11 and 12, in the information recording/reproducing device 250 according to the third embodiment, on an XY scanner 516, a recording layer 13 is provided on an electrode 521. A probe array is opposed to this recording layer 13.

The probe array includes a substrate 523 and a plurality of probes (heads) 524 arrayed on one side of the substrate 523. The plurality of probes 524 are each made of e.g. a cantilever, and driven by a multiplex driver 525, 526.

Each of the plurality of probes 524 can be independently actuated using a microactuator in the substrate 523. However, the probes 524 can also be collectively subjected to the same operation to access the data area 531 of the storage medium (recording layer 13).

First, using the multiplex driver 525, 526, all the probes 524 are reciprocated at a fixed cycle in the X direction to read Y-direction position information from the servo area 532 of the storage medium (recording layer 13). The Y-direction position information is transferred to the driver 515.

Based on this position information, the driver 515 drives the XY scanner 516 and moves the storage medium (recording layer 13) in the Y direction to perform positioning between the storage medium (recording layer 13) and the probes.

Upon completion of positioning therebetween, all the probes 524 on the data areas 531 are simultaneously and continuously subjected to reading or writing of data.

Reading and writing of data are performed continuously because the probes 524 are reciprocated in the X direction. Furthermore, reading and writing of data are performed on the data area 531 on a row-by-row basis by sequentially changing the Y-direction position of the recording layer 13.

Alternatively, the recording layer 13 may be reciprocated at a fixed cycle in the X direction to read position information from the storage medium (recording layer 13), and the probes 524 may be moved in the Y direction.

The recording layer 13 is provided on, e.g., the electrode 521 provided on the substrate 520.

The recording layer 13 includes a plurality of data areas 531, and servo areas 532 each located on either end in the X direction of the plurality of data areas 531. The plurality of data areas 531 constitute a main part of the recording layer 13.

The servo area 532 stores a servo burst signal. The servo burst signal indicates Y-direction position information in the data area 531.

Besides these pieces of information, the recording layer 13 further includes an address area for storing address data and a preamble area for synchronization.

Data and servo burst signals are stored in the recording layer 13 as memory bits (electrical resistance variation). The information of memory bits "1" and "0" is read by detecting the electrical resistance of the recording layer 13.

In the specific example, one data area 531 is associated with one probe (head), and one servo area 532 is associated with one probe.

The data area 531 is composed of a plurality of tracks. A particular track in the data area 531 is specified by an address signal read from the address area. On the other hand, the servo burst signal read from the servo area 532 is intended to move the probe 524 to the center of the track to eliminate read error of the memory bit.

Here, the head position control technique for HDD can be utilized by associating the X direction with the down-track direction and the Y direction with the track direction.

Each probe 524 is connected to a driver section 600 through the multiplex driver 525, 526, for instance. The driver section 600 supplies each probe 524 with at least one of voltage and current for information recording. Then, by the voltage and current supplied through the probe 524, the recording layer 13 changes between the high resistance state and the low resistance state. Furthermore, the driver section 600 detects the high resistance state and the low resistance state recorded in the recording layer 13 to read the recorded information.

The information recording/reproducing device 250 thus configured includes a recording layer 13, and a driver section 600 for producing state change in the recording layer 13 to record information by at least one of application of voltage to the recording layer 13 and passage of current to the recording layer 13.

The information recording/reproducing device 250 further includes a probe 524 associated with the recording layer 13. The driver section 600 performs at least one of application of voltage and passage of current to a recording unit of the recording layer 13 through the probe 524. Thus, state change is produced in the recording layer 13 to record information.

The recording layer 13 can be at least one of the recording layers 13 described with reference to the first and second embodiment.

The driver section 600 can include the aforementioned driver 515 and XY scanner 516. Conversely, the driver section may be included in the aforementioned driver 515 and XY scanner 516.

Thus, by the aforementioned effect described with reference to the first and second embodiment, the information recording/reproducing device 250 of the probe memory type according to the embodiment can also provide a nonvolatile information recording/reproducing device having low power consumption and high stability in repeated operation.

Fourth Embodiment

A fourth embodiment is an information recording/reproducing device of the flash memory type.

FIG. 13 is a schematic sectional view illustrating the configuration of the main part of the information recording/reproducing device according to the fourth embodiment.

FIG. 14 is a schematic sectional view illustrating the operation of the information recording/reproducing device according to the fourth embodiment.

As shown in FIG. 13, the information recording/reproducing device 260 according to the embodiment includes a memory cell of the flash memory type. This memory cell is made of a MIS (metal-insulator-semiconductor) transistor.

More specifically, diffusion layers 42 are formed in the surface region of a semiconductor substrate 41. A gate insulating layer 43 is formed on the channel region between the diffusion layers 42. The recording layer 13 according to the examples is formed on the gate insulating layer 43. A control gate electrode 45 is formed on the recording layer 13.

The semiconductor substrate 41 may be a well region. The semiconductor substrate 41 and the diffusion layer 42 have opposite conductivity types. The control gate electrode 45 serves as a word line and is made of e.g. conductive polysilicon.

The recording layer 13 can have at least one of the configurations described in the first and second embodiment.

In this case, a driver section, not shown, is connected to the control gate electrode 45. The driver section performs at least one of application of voltage to the recording layer 13 and passage of current to the recording layer 13 through the control gate electrode 45.

In the foregoing, one of the aforementioned upper electrode 14 and lower electrode 12 provided in contact with the recording layer 13 may double as, e.g., the control gate electrode 45.

As shown in FIG. 14, in the set (write) operation SO, the control gate electrode 45 is applied with a potential V1, and the semiconductor substrate 41 is applied with a potential V2.

The difference between the potential V1 and the potential V2 is large enough to produce state change in, i.e., to change the resistance of, the recording layer 13. However, the polarity of the potential difference is not particularly limited. That is, either of V1>V2 and V1<V2 may be used.

For instance, in the initial state (reset state), it is assumed that the recording layer 13 is in the high resistance state HR. This effectively corresponds to thickening of the gate insulating layer 43, and hence raises the threshold of the memory cell (MIS transistor).

From this state, the potentials V1, V2 are applied to turn the recording layer 13 to the low resistance state LR. This effectively corresponds to thinning of the gate insulating layer 43, and hence lowers the threshold of the memory cell (MIS transistor).

In the foregoing, the potential V2 is applied to the semiconductor substrate 41. Instead, the potential V2 may be transferred from the diffusion layer 42 to the channel region of the memory cell.

In this figure, the arrow Ae represents migration of electrons, and the arrow Ai represents migration of ions.

On the other hand, in the reset (erase) operation RO, the control gate electrode 45 is applied with a potential V1', one of the diffusion layers 42 is applied with a potential V3, and the other of the diffusion layers 42 is applied with a potential V4 (<V3).

The potential V1' is set to a value exceeding the threshold of the memory cell in the set state.

At this time, the memory cell is turned on. Electrons flow from the other diffusion layer 42 toward the one diffusion layer 42, and hot electrons are generated. These hot electrons are injected into the recording layer 13 through the gate insulating layer 43. Hence, the temperature of the recording layer 13 increases.

Thus, the recording layer 13 changes from the low resistance state LR to the high resistance state HR. This effectively corresponds to thickening of the gate insulating layer 43, and hence raises the threshold of the memory cell (MIS transistor).

Thus, by a principle similar to that of the flash memory, the threshold of the memory cell can be varied, and the memory cell can be used as an information recording/reproducing device.

Here, the recording layer 13 is at least one of the recording layers 13 described in the first and second embodiment. Hence, the information recording/reproducing device 260 according to the embodiment can provide a nonvolatile information recording/reproducing device having low power consumption and high stability in repeated operation.

Figure 15:
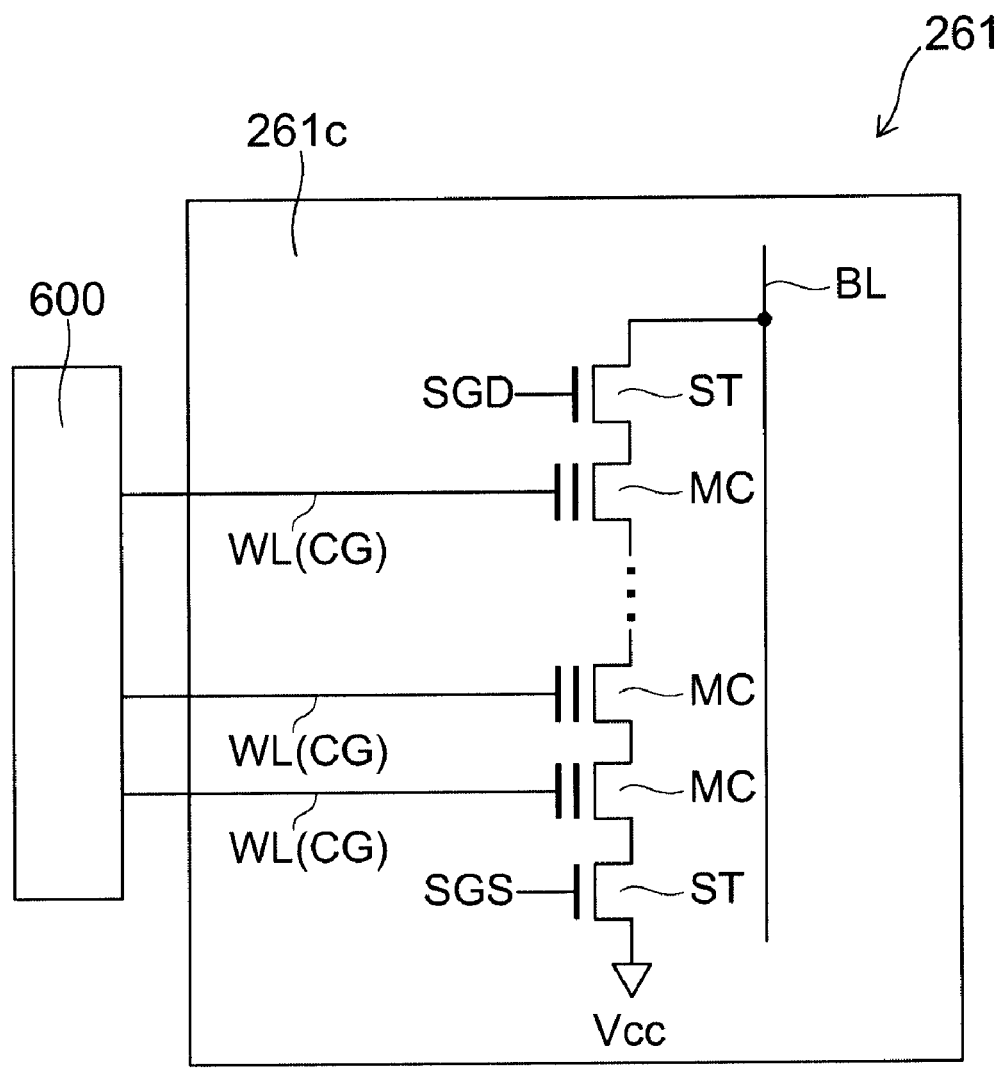
FIG. 15 is a schematic diagram illustrating the configuration of an alternative information recording/reproducing device according to the fourth embodiment.

FIG. 15 is a schematic diagram illustrating the configuration of an alternative information recording/reproducing device according to the fourth embodiment.

Figure 16:
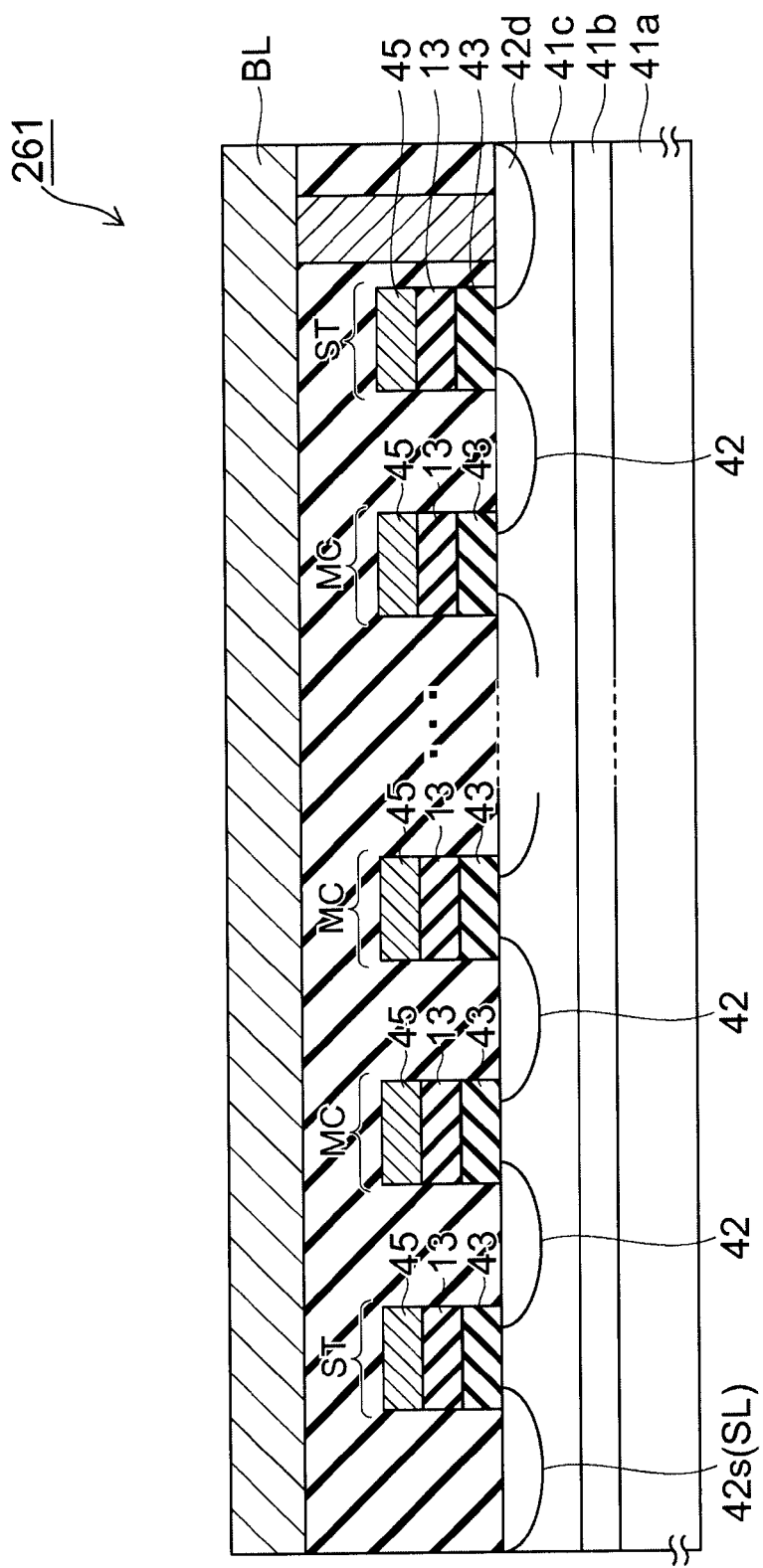
FIG. 16 is a schematic sectional view illustrating the main part of the alternative information recording/reproducing device according to the fourth embodiment.

FIG. 16 is a schematic sectional view illustrating the main part of the alternative information recording/reproducing device according to the fourth embodiment.

More specifically, the alternative information recording/reproducing device 261 according to the embodiment is a NAND flash memory. FIG. 15 illustrates a NAND cell unit 261c and a driver section 600 connected thereto. FIG. 16 illustrates the structure of the NAND cell unit 261c.

As shown in FIGS. 15 and 16, an N-type well region 41b and a P-type well region 41c are formed in a P-type semiconductor substrate 41a. The NAND cell unit 261c is formed in the P-type well region 41c.

The NAND cell unit 261c is composed of a NAND string with a plurality of memory cells MC connected in series, and a total of two select gate transistors ST each connected to either end of the NAND string.

The memory cell MC and the select gate transistor ST have the same structure. Specifically, these are composed of N-type diffusion layers 42, a gate insulating layer 43 on the channel region between the N-type diffusion layers 42, a recording layer 13 on the gate insulating layer 43, and a control gate electrode 45 on the recording layer 13.

Each control gate electrode 45 (CG) is electrically connected to the driver section 600. The driver section 600 may be provided in the substrate including the NAND cell unit 261c, or may be provided in a different substrate.

The state (high resistance state HR and low resistance state LR) of the recording layer 13 of the memory cell MC can be changed by the aforementioned basic operation. In contrast, the recording layer 13 of the select gate transistor ST is fixed to the set state, i.e., the low resistance state LR.

One of the select gate transistors ST is connected to a source line SL. The other of the select gate transistors ST is connected to a bit line BL.

Before the set (write) operation SO, all the memory cells in the NAND cell unit 261c are placed in the reset state (high resistance).

The set (write) operation SO is performed sequentially one by one from the memory cell MC on the source line SL side toward the memory cell on the bit line BL side.

The selected word line (control gate electrode) WL is applied with V1 (positive potential) as a write potential. The non-selected word line WL is applied with $V_{pass}$ as a transfer potential (the potential turning on the memory cell MC).

The select gate transistor ST on the source line SL side is turned off, and the select gate transistor ST on the bit line BL side is turned on. Then, program data is transferred from the bit line BL to the channel region of the selected memory cell MC.

For instance, when the program data is "1", a write disable potential (e.g., a potential nearly equal to V1) is transferred to the channel region of the selected memory cell MC to prevent the resistance of the recording layer 13 of the selected memory cell MC from changing from the high state to the low state.

When the program data is "0", V2 (<V1) is transferred to the channel region of the selected memory cell MC to change the resistance of the recording layer 13 of the selected memory cell MC from the high state to the low state.

On the other hand, in the reset (erase) operation RO, for instance, all the word lines (control gate electrodes) WL are applied with V1' to turn on all the memory cells MC in the NAND cell unit 261c. Furthermore, the two select gate transistors ST are turned on to apply V3 to the bit line BL and V4 (<V3) to the source line SL.

At this time, hot electrons are injected into the recording layer 13 of all the memory cells MC in the NAND cell unit 261c. Hence, the reset operation is collectively performed on all the memory cells MC in the NAND cell unit 261c.

In the read operation, the selected word line (control gate electrode) WL is applied with a read potential (positive potential), and the non-selected word line (control gate electrode) WL is applied with a potential which always turns on the memory cell MC irrespective of its data "0" and "1".

Furthermore, the two select gate transistors ST are turned on to supply a read current to the NAND string.

Upon application of the read potential, the selected memory cell MC is turned on or off depending on the value of the data stored therein. Hence, the data can be read by, e.g., detecting the variation of the read current.

In the structure illustrated in FIG. 16, the select gate transistor ST has the same structure as the memory cell MC. However, it may be modified as follows.

Figure 17:
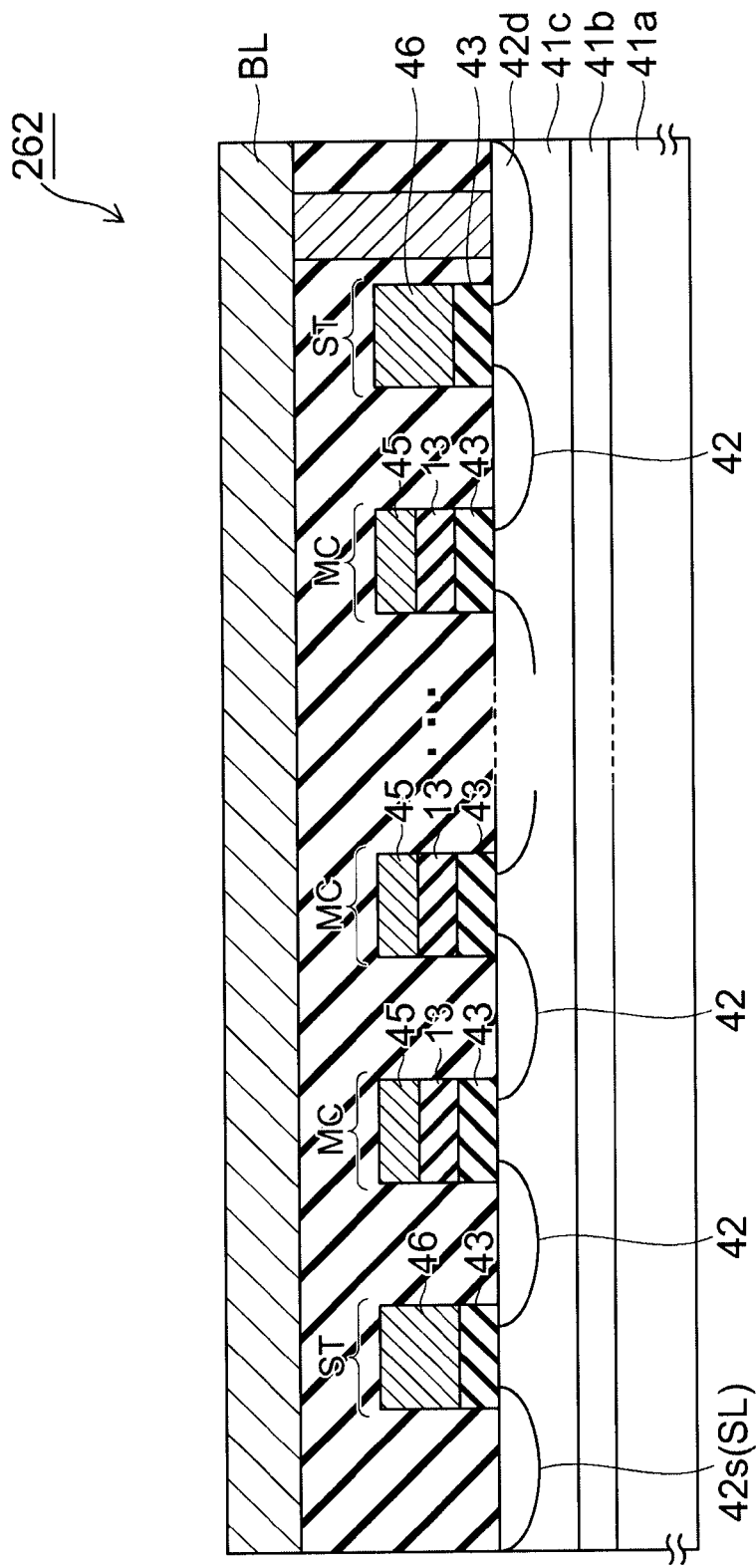
FIG. 17 is a schematic sectional view illustrating the main part of an information recording/reproducing device of a variation according to the fourth embodiment.

FIG. 17 is a schematic sectional view illustrating the main part of an information recording/reproducing device of a variation according to the fourth embodiment.

As shown in FIG. 17, in the information recording/reproducing device 262 of the variation according to the embodiment, the select gate transistor ST is a normal MIS transistor without including a recording layer. Thus, the structure of the select transistor ST is arbitrary.

Figure 18:
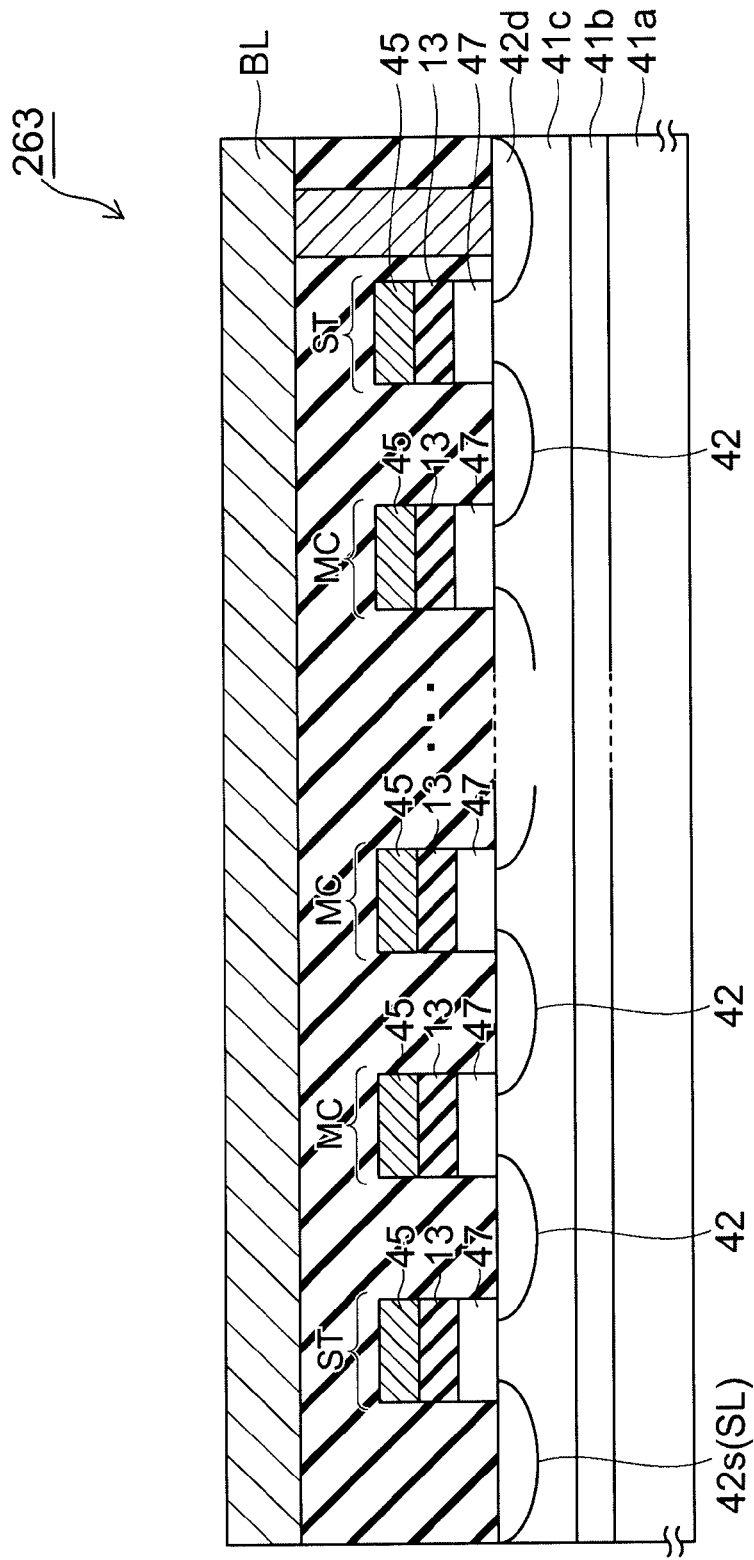
FIG. 18 is a schematic sectional view illustrating the main part of an information recording/reproducing device of a variation according to the fourth embodiment.

FIG. 18 is a schematic sectional view illustrating the main part of an information recording/reproducing device of a variation according to the fourth embodiment.

As shown in FIG. 18, in the information recording/reproducing device 263 of the variation according to the embodiment, the gate insulating layer of a plurality of memory cells MC constituting a NAND string is replaced by a P-type semiconductor layer 47.

With the increase of integration density, in a miniaturized memory cell MC, the P-type semiconductor layer 47 is filled with the depletion layer when no voltage is applied thereto.

In the set (write) operation SO, the control gate electrode 45 of the selected memory cell MC is applied with a positive write potential (e.g., 3.5 V), and the control gate electrode 45 of the non-selected memory cell MC is applied with a positive transfer potential (e.g., 1 V).

At this time, the surface of the P-type well region 41c of the plurality of memory cells MC in the NAND string is inverted from P-type to N-type, and a channel is formed therein.

Then, as described above, the select gate transistor ST on the bit line BL side is turned on, and program data "0" is transferred from the bit line BL to the channel region of the selected memory cell MC. Thus, the set operation can be performed.

On the other hand, in the reset (erase) operation RO, for instance, all the control gate electrodes 45 are applied with a negative erase potential (e.g., −3.5 V), and the P-type well region 41c and the P-type semiconductor layer 47 are applied with the ground potential (0 V). Then, the reset (erase) operation RO can be collectively performed on all the memory cells MC constituting the NAND string.

In the read operation, the control gate electrode 45 of the selected memory cell MC is applied with a positive read potential (e.g., 0.5 V), and the control gate electrode 45 of the non-selected memory cell MC is applied with a transfer potential (e.g., 1 V) which always turns on the memory cell MC irrespective of its data "0" and "1".

Here, it is assumed that the threshold voltage Vth "1" of the memory cell MC in the state "1" is in the range of 0 V<Vth "1"<0.5 V, and the threshold voltage Vth "0" of the memory cell MC in the state "0" is in the range of 0.5 V<Vth "0"<1 V.

Furthermore, the two select gate transistors ST are turned on to supply a read current to the NAND string.

Then, the amount of current flowing in the NAND string depends on the value of the data stored in the selected memory cell MC. Hence, the data can be read by detecting this variation.

In the variation, preferably, the hole doping amount of the P-type semiconductor layer 47 is larger than that of the P-type well region 41c, and the Fermi level of the P-type semiconductor layer 47 is deeper than that of the P-type well region 41c by approximately 0.5 V.

This is in order that inversion from P-type to N-type may be started in the surface portion of the P-type well region 41c between the N-type diffusion layers 42 to form a channel when the control gate electrode 45 is applied with a positive potential.

Thus, for instance, in the write operation, the channel of the non-selected memory cell MC is formed only at the interface of the P-type well region 41c and the P-type semiconductor layer 47. In the read operation, the channel of the plurality of memory cells MC in the NAND string is formed only at the interface of the P-type well region 41c and the P-type semiconductor layer 47.

That is, even if the recording layer 13 of the memory cell MC is in the low resistance state LR, no short circuit occurs between the diffusion layer 42 and the control gate electrode 45.

Figure 19:
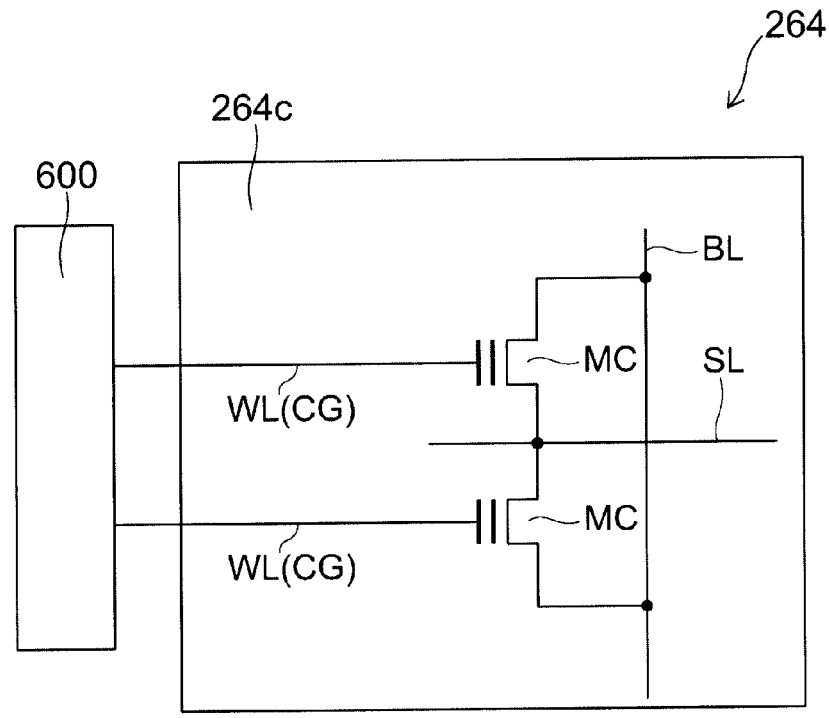
FIG. 19 is a schematic diagram illustrating the configuration of an alternative information recording/reproducing device according to the fourth embodiment.

FIG. 19 is a schematic diagram illustrating the configuration of the main part of an alternative information recording/reproducing device according to the fourth embodiment.

Figure 20:
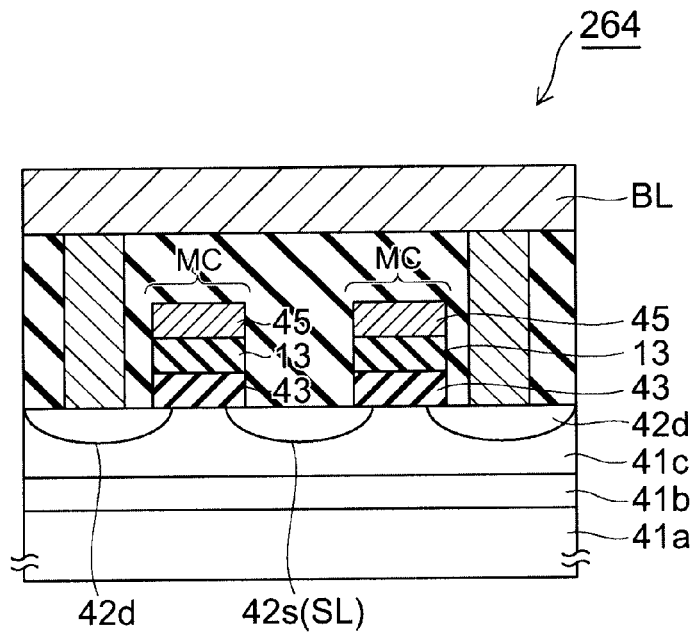
FIG. 20 is a schematic sectional view illustrating the main part of the alternative information recording/reproducing device according to the fourth embodiment.

FIG. 20 is a schematic sectional view illustrating the main part of the alternative information recording/reproducing device according to the fourth embodiment.

More specifically, the alternative information recording/reproducing device 264 according to the embodiment is a NOR flash memory. FIG. 19 illustrates a NOR cell unit 264c and a driver section 600 connected thereto. FIG. 20 illustrates the structure of the NOR cell unit 264c.

As shown in FIGS. 19 and 20, an N-type well region 41b and a P-type well region 41c are formed in a P-type semiconductor substrate 41a. A NOR cell is formed in the P-type well region 41c.

The NOR cell is made of one memory cell (MIS transistor) MC connected between a bit line BL and a source line SL.

The memory cell MC is composed of N-type diffusion layers 42, a gate insulating layer 43 on the channel region between the N-type diffusion layers 42, a recording layer 13 on the gate insulating layer 43, and a control gate electrode 45 on the recording layer 13.

Each control gate electrode 45 (CG) is electrically connected to the driver section 600. The driver section 600 may be provided in the substrate including the NOR cell unit 264c, or may be provided in a different substrate.

The state (high resistance state HR and low resistance state LR) of the recording layer 13 of the memory cell MC can be changed by the aforementioned basic operation.

Figure 21:
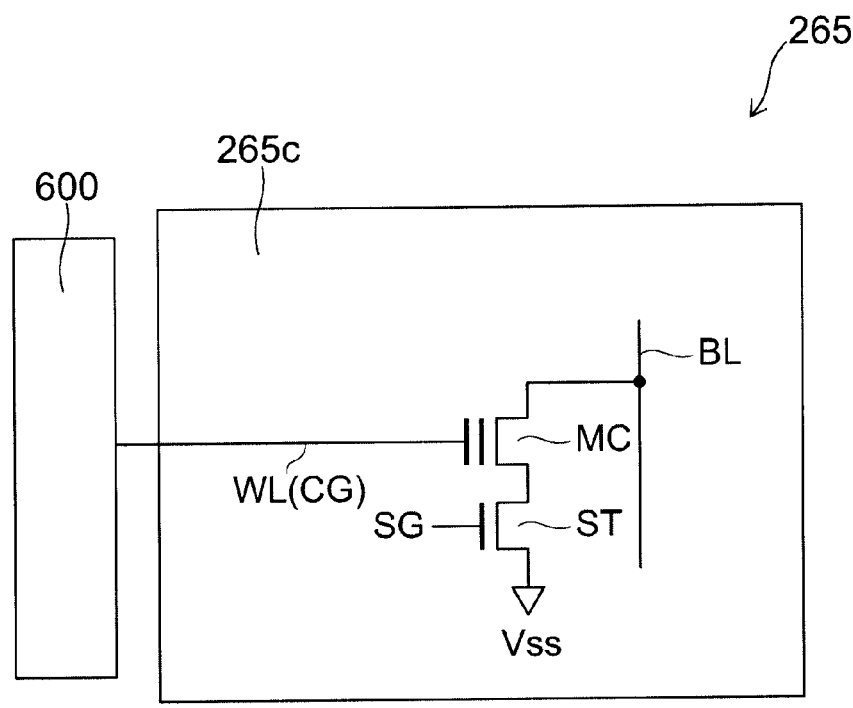
FIG. 21 is a schematic diagram illustrating the configuration of an alternative information recording/reproducing device according to the fourth embodiment.

FIG. 21 is a schematic diagram illustrating the configuration of the main part of an alternative information recording/reproducing device according to the fourth embodiment.

Figure 22:
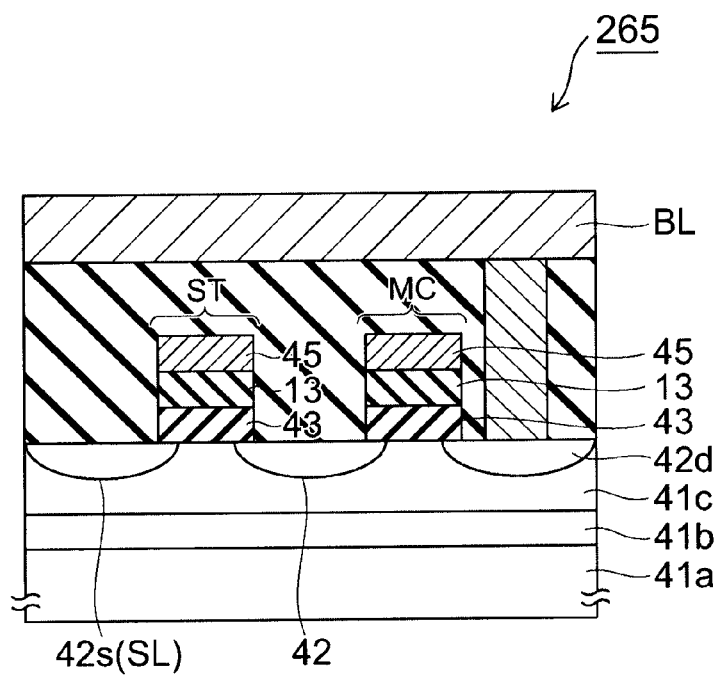
FIG. 22 is a schematic sectional view illustrating the main part of the alternative information recording/reproducing device according to the fourth embodiment.

FIG. 22 is a schematic sectional view illustrating the main part of the alternative information recording/reproducing device according to the fourth embodiment.

More specifically, the alternative information recording/reproducing device 265 according to the embodiment is a 2Tr flash memory. FIG. 21 illustrates a 2Tr cell unit 265c and a driver section 600 connected thereto. FIG. 22 illustrates the structure of the 2Tr cell unit 265c.

As shown in FIGS. 21 and 22, the 2Tr cell unit 265c has a cell structure having the feature of the NAND cell unit and the feature of the NOR cell in combination.

An N-type well region 41b and a P-type well region 41c are formed in a P-type semiconductor substrate 41a. The 2Tr cell unit 265c is formed in the P-type well region 41c.

The 2Tr cell unit 265c is composed of one memory cell MC and one select gate transistor ST connected in series.

The memory cell MC and the select gate transistor ST have the same structure. Specifically, these are composed of N-type diffusion layers 42, a gate insulating layer 43 on the channel region between the N-type diffusion layers 42, a recording layer 13 on the gate insulating layer 43, and a control gate electrode 45 on the recording layer 13.

Each control gate electrode 45 (CG) is electrically connected to the driver section 600. The driver section 600 may be provided in the substrate including the 2Tr cell unit 265c, or may be provided in a different substrate.

The state (high resistance state HR and low resistance state LR) of the recording layer 13 of the memory cell MC can be changed by the aforementioned basic operation. In contrast, the recording layer 13 of the select gate transistor ST is fixed to the set state, i.e., the low resistance state LR.

The select gate transistor ST is connected to a source line SL. The memory cell MC is connected to a bit line BL.

The state (high resistance state HR and low resistance state LR) of the recording layer 13 of the memory cell MC can be changed by the aforementioned basic operation.

In the structure illustrated in FIG. 22, the select gate transistor ST has the same structure as the memory cell MC. However, it may be modified as follows.

Figure 23:
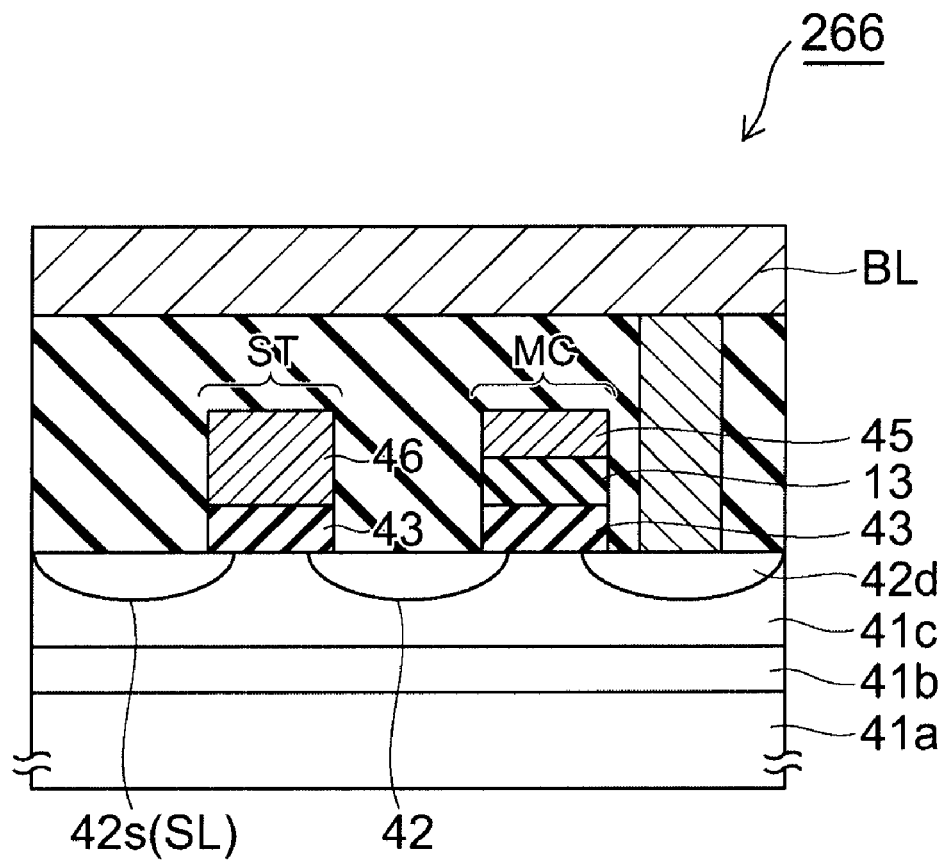
FIG. 23 is a schematic sectional view illustrating the main part of an information recording/reproducing device of a variation according to the fourth embodiment.

FIG. 23 is a schematic sectional view illustrating the main part of an information recording/reproducing device of a variation according to the fourth embodiment.

As shown in FIG. 23, in the information recording/reproducing device 266 of the variation according to the embodiment, the select gate transistor ST is a normal MIS transistor without including a recording layer. Thus, the structure of the select gate transistor is arbitrary.

The embodiment provides a nonvolatile information recording/reproducing device having low power consumption and high thermal stability.

The embodiments of the invention have been described above with reference to specific examples. However, the invention is not limited to these specific examples. For instance, any specific configurations of the components constituting the information recording/reproducing device are encompassed within the scope of the invention as long as those skilled in the art can similarly practice the invention and achieve similar effects by suitably selecting such configurations from conventionally known ones.

Furthermore, any two or more components of the specific examples can be combined with each other as long as technically feasible. Such combinations are also encompassed within the scope of the invention as long as they fall within the spirit of the invention.

Furthermore, those skilled in the art can suitably modify and implement the information recording/reproducing device described above in the embodiments of the invention. All the information recording/reproducing devices thus modified are also encompassed within the scope of the invention as long as they fall within the spirit of the invention.

Furthermore, those skilled in the art can conceive various variations and modifications within the spirit of the invention. It is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An information recording/reproducing device comprising:
    a recording layer having a first layer including a first compound including a mixed crystal of
        a first oxide containing a first metallic element; and
        a second oxide having a crystal structure being same as the first oxide and containing a second metallic element different from the first metallic element; and
    a driver section configured to produce state change in the recording layer to record information by at least one of application of voltage to the recording layer and passage of current to the recording layer,
    composition ratio of an element having a smaller ionic radius of the first metallic element and the second metallic element being greater than or equal to percolation threshold of a lattice formed of ions of the first metallic element and ions of the second metallic element based on the crystal structure.

2. The device according to claim 1, wherein at least one of the first metallic element and the second metallic element is a transition element of Groups 4-11.

3. The device according to claim 1, wherein at least one of the first metallic element and the second metallic element is at least one selected from the group consisting of Ni, Co, Fe, Mn, Ti, V, Cr, Ta, Nb, Mo, and W.

4. The device according to claim 1, wherein at least one of the first metallic element and the second metallic element is at least one selected from the group consisting of Mg, Sn, Ge, Pb, Al, Ga, and Y.

5. The device according to claim 1, wherein the crystal structure is rock-salt structure, and the composition ratio of the element having a smaller ionic radius of the first metallic element and the second metallic element is 0.199 or more.

6. The device according to claim 5, wherein at least one of the first metallic element and the second metallic element is at least one selected from the group consisting of Ni, Co, Fe, Mn, Ti, V, and Mg.

7. The device according to claim 1, wherein the crystal structure is rutile structure, and the composition ratio of the element having a smaller ionic radius of the first metallic element and the second metallic element is 0.245 or more.

8. The device according to claim 7, wherein at least one of the first metallic element and the second metallic element is at least one selected from the group consisting of Ti, Mn, Cr, Mo, Nb, W, Ta, Ir, and Ru, and at least one other of the first metallic element and the second metallic element is at least one selected from the group consisting of Sn, Ge, and Pb.

9. The device according to claim 1, wherein the crystal structure is C-rare earth structure, and the composition ratio of the element having a smaller ionic radius of the first metallic element and the second metallic element is 0.199 or more.

10. The device according to claim 9, wherein the first metallic element is Mn, and the second metallic element is Y.

11. The device according to claim 1, wherein the crystal structure is corundum structure, and the composition ratio of the element having a smaller ionic radius of the first metallic element and the second metallic element is 0.245 or more.

12. The device according to claim 11, wherein the first metallic element is at least one selected from the group consisting of Ti, Cr, Fe, and V, and the second metallic element is at least one selected from the group consisting of Al and Ga.

13. The device according to claim 1, wherein the composition ratio of the element having a smaller ionic radius of the first metallic element and the second metallic element is 40% or more.

14. The device according to claim 1, wherein the recording layer further includes a second layer provided in contact with the first layer and made of a second compound including a vacant site capable of containing a first cation, the first cation including an ion of at least one of the first metallic element and the second metallic element.

15. The device according to claim 14, wherein the first layer has a lower electron Fermi level than the second layer.

16. The device according to claim 1, further comprising:
a word line and a bit line sandwiching the recording layer,
the driver section being configured to perform at least one of the application of the voltage to the recording layer and the passage of the current to the recording layer through the word line and the bit line.

17. The device according to claim 1, further comprising:
a probe provided with the recording layer,
the driver section being configured to perform at least one of the application of the voltage and the passage of the current to a recording unit of the recording layer through the probe.

18. The device according to claim 1, further comprising:
a MIS transistor including a gate electrode and a gate insulating layer sandwiching the recording layer,
the driver section being configured to perform at least one of the application of the voltage to the recording layer and the passage of the current to the recording layer through the gate electrode.

19. The device according to claim 1, further comprising:
a first and second second-conductivity-type semiconductor region provided in a first-conductivity-type semiconductor substrate;
a first-conductivity-type semiconductor region between the first and second second-conductivity-type semiconductor region; and
a gate electrode configured to control electrical continuity/discontinuity between the first and second second-conductivity-type semiconductor region,
the recording layer being located between the gate electrode and the first-conductivity-type semiconductor region, and
the driver section being configured to perform at least one of the application of the voltage to the recording layer and the passage of the current to the recording layer through the gate electrode.

* * * * *